United States Patent
Blank et al.

(10) Patent No.: US 6,704,594 B1
(45) Date of Patent: Mar. 9, 2004

(54) MAGNETIC RESONANCE IMAGING DEVICE

(75) Inventors: Aharon Blank, Kiriat Ono (IL); Gil Alexandrowicz, Jerusalem (IL); Erez Golan, Tel Aviv (IL)

(73) Assignee: TopSpin Medical (Israel) Limited, Lod (IL)

( * ) Notice: Subject to any disclaimer, the term of this patent is extended or adjusted under 35 U.S.C. 154(b) by 18 days.

(21) Appl. No.: 09/705,732

(22) Filed: Nov. 6, 2000

(51) Int. Cl.$^7$ ................................................ A61B 5/05
(52) U.S. Cl. .................... 600/423; 600/407; 600/409; 600/410; 600/421; 324/318; 324/322; 128/899
(58) Field of Search ................. 324/303, 307, 324/309, 318, 324; 128/899, 898; 600/407, 410, 420, 433–437

(56) References Cited

U.S. PATENT DOCUMENTS

| | | | |
|---|---|---|---|
| 3,617,867 A | * 11/1971 | Herzog | ........................ 44/564 |
| 4,350,955 A | 9/1982 | Jackson et al. | |
| 4,542,343 A | 9/1985 | Brown | |

(List continued on next page.)

FOREIGN PATENT DOCUMENTS

| | | |
|---|---|---|
| DE | 198 38 658 | 2/2000 |
| EP | 1 006 366 | 6/2000 |
| FR | 2 793 882 | 11/2000 |
| GB | 2 346 216 | 8/2000 |
| WO | WO 98/29639 | 7/1998 |
| WO | WO 01/42807 A2 | 6/2001 |

OTHER PUBLICATIONS

Richard K. Cooper et al., "Remote (Inside–Out) NMR. I. Remote Production of a Region of Homogeneous Magnetic Field", *J. Magn. Res.*, 1980, p. 400–410, vol. 41.

R.L. Kleinberg et al, "Novel NMR Apparatus for Investigating an External Sample", *J. Magn. Res.*, 1992, p. 466–485, vol. 97.

Krishna Kandarpa et al., "Prototype Miniature Endoluminal MR Imaging Catheter", *Vasc. and Interventional Radiology*, 1993, p. 419–427, vol. 4.

Marino, R. A..;"Enhanced Coupling to Small NQR Samples Using Ferrite Cpoils;" Jan. 1980; Journal of Molecular Structure; vol. 58, pp. 79–83; XP000986387.

*Primary Examiner*—Marvin M. Lateef
*Assistant Examiner*—Barry Pass
(74) *Attorney, Agent, or Firm*—Browdy and Neimark, P.L.L.C.

(57) ABSTRACT

An imaging probe and method and an MRI system utilizing the same are presented. The probe comprises first and second magnetic field sources, and a receiver of NMR signals. The first magnetic field source creates a primary, substantially non-homogeneous, static magnetic field in a region of interest in a medium outside the probe. The second magnetic field source creates an external time-varying magnetic field, which when being applied to the region of the static magnetic field, is capable of exciting nuclei in an extended sub-region of this region and generating the NMR signals.

51 Claims, 10 Drawing Sheets

U.S. PATENT DOCUMENTS

| | | | |
|---|---|---|---|
| 4,590,427 A | 5/1986 | Fukushima et al. | |
| 4,629,986 A | 12/1986 | Clow et al. | |
| 4,656,425 A | 4/1987 | Bendel | |
| 4,714,881 A | * 12/1987 | Givens | 324/303 |
| 4,717,876 A | 1/1988 | Masi et al. | |
| 4,717,877 A | 1/1988 | Taicher et al. | |
| 4,717,878 A | 1/1988 | Taicher et al. | |
| 4,829,247 A | * 5/1989 | Wallrafen | 324/207.12 |
| 5,023,554 A | 6/1991 | Cho et al. | |
| 5,050,607 A | 9/1991 | Bradley et al. | |
| 5,212,447 A | 5/1993 | Paltiel | |
| 5,280,243 A | 1/1994 | Miller | |
| 5,303,707 A | 4/1994 | Young | |
| 5,304,930 A | 4/1994 | Crowley et al. | |
| 5,390,673 A | 2/1995 | Kikinis | |
| 5,492,119 A | * 2/1996 | Abrams | 600/375 |
| 5,493,225 A | 2/1996 | Crowley et al. | |
| 5,517,118 A | 5/1996 | Crowley et al. | |
| 5,572,132 A | * 11/1996 | Pulyer et al. | 324/318 |
| 5,610,522 A | 3/1997 | Locatelli et al. | |
| 5,699,801 A | 12/1997 | Atalar et al. | |
| 5,767,675 A | 6/1998 | Crowley et al. | |
| 5,935,065 A | 8/1999 | Rose, Jr. et al. | |
| 6,133,734 A | 10/2000 | McKeon | |
| 6,377,048 B1 | * 4/2002 | Golan et al. | 324/318 |

\* cited by examiner

MAGNETIC RESONANCE IMAGING DEVICE

FIELD OF THE INVENTION

This invention is generally in the field of Nuclear Magnetic Resonance (NMR) based techniques, and relates to a device and method for magnetic resonance imaging (MRI). Although not limited thereto, the invention is particularly useful for medical purposes, to acquire images of cavities in a human body, but may also be used in any industrial application.

BACKGROUND OF THE INVENTION

MRI is a known imaging technique, used especially in cases where soft tissues are to be differentiated. Alternative techniques, such as ultrasound or X-ray based techniques, which mostly utilize spatial variations in material density, have inherently limited capabilities in differentiating soft tissues.

NMR is a term used to describe the physical phenomenon in which nuclei, when placed in a static magnetic field, respond to a superimposed alternating (RF) magnetic field. It is known that when the RF magnetic field has a component perpendicular in direction to the static magnetic field, and when this component oscillates at a frequency known as the resonance frequency of the nuclei, then the nuclei can be excited by the RF magnetic field. This excitation is manifested in the temporal behavior of nuclear magnetization following the excitation phase, which in turn can be detected by a reception coil and termed the NMR signal. A key element in the utilization of NMR for imaging purposes is that the resonance frequency, known as the Larmor frequency, has a linear dependence on the intensity of the static magnetic field in which the nuclei reside. By applying a static magnetic field, of which the intensity is spatially dependent, it is possible to differentiate signals received from nuclei residing in different magnetic field intensities, and therefore in different spatial locations. The techniques, which utilize NMR phenomena for obtaining spatial distribution images of nuclei and nuclear characteristics, are termed MRI.

In conventional MRI techniques spatial resolution is achieved by superimposing a stationary magnetic field gradient on a static homogeneous magnetic field. By using a series of excitations and signal receptions under various gradient orientations a complete image of nuclear distribution can be obtained. Furthermore, it is a unique quality of MRI that the spatial distribution of chemical and physical characteristics of materials, such as biological tissue, can be enhanced and contrasted in many different manners by varying the excitation scheme, known as the MRI sequence, and by using an appropriate processing method.

The commercial MRI-based systems suffer from the relatively low signal sensitivity that requires long image acquisition time. Moreover, these systems are expensive and complicated in operation. These drawbacks become more essential when an MRI system is used for imaging relatively large volumes, such as the human body. This necessitates producing a highly homogeneous magnetic field over the entire imaged volume, leading to extensive equipment size. Additionally, the unavoidable distance between a signal receiving coil and most of the imaging volume significantly reduces imaging sensitivity.

There are a number of applications in which there is a need for imaging of relatively small volumes, where some of the above-noted shortcomings may be overcome. One such application is geophysical well logging, where the "whole body" MRI approach is obviously impossible. Here, a hole is drilled in the earth's crust and measuring equipment is inserted thereinto for local imaging of the surrounding medium at different depths.

Several methods and apparatuses have been developed aimed at extracting NMR data from the bore hole walls, including, U.S. Pat. Nos. 4,350,955; 4,629,986; 4,717,877; 4,717,878; 4,717,876; 5,212,447; 5,280,243; and "Remote 'Inside Out' NMR", J. Magn. Res., 41. p. 400, 1980; "Novel NMR Apparatus for investigating an External Sample", Kleinberg el al., J. Magn. Res., 97, p. 466, 1992.

The apparatuses disclosed in the above documents are based on several permanent magnet configurations designed to create relatively homogeneous static magnetic fields in a region external to the apparatus itself. RF coils are typically used in such apparatuses to excite the nuclei in the homogeneous region and, in turn, receive the created NMR signal. To create an external region of homogeneous magnetic field, the magnetic configurations have to be carefully designed, to reconcile the fact that small deviations in structure may have a disastrous effect on magnetic field homogeneity. It turns out that such a region of homogeneous magnetic field can be created only within a narrow radial distance around a fixed position relative to the magnet configuration, and that the characteristic magnetic field intensities created in this region are generally low. As a result, such apparatuses, although permitting NMR measurements, have only limited use as imaging probes for imaging regions of the bore-hole walls.

With respect to medical MRI-based applications, the potential of using an intra-cavity receiver coil has been investigated, and is disclosed, for example, in the following publications: Kandarpa et al., J. Vasc. and Interventional Radiology, 4, pp. 419–427, 1993; and U.S. Pat. No. 5,699, 801. Different designs for catheter-based receiver coils are proposed for insertion into body cavities, such as arteries during interventional procedures. These coils, when located in proximity of the region of interest, improve reception sensitivity, thus allowing high-resolution imaging of these regions. Notwithstanding the fact that this approach enables the resolution to be substantially improved, it still suffers from two major drawbacks: (1) the need for the bulky external setup in order to create the static homogeneous magnetic field and to transmit the RF excitation signal; and (2) the need to maintain the orientation of the coil axis within certain limits relative to the external magnetic field, in order to insure satisfactory image quality. Because of these two limitations, the concept of intra-cavity receiver coil is only half-way towards designing a fully autonomous intra-cavity imaging probe.

U.S. Pat. No. 5,572,132 discloses a concept of combining the static magnetic field source with the RF coil in a self contained intra-cavity medical imaging probe. Here, several permanent magnet configurations are proposed, for creating a homogeneous magnetic field region external to the imaging probe itself, a manner somewhat analogous to the concept upon which the bore-hole apparatuses are based. Also disclosed in this patent are several RF and gradient coil configurations that may be integrated in the imaging probe in order to allow autonomous imaging capabilities. The suggested configurations, nevertheless, suffer from the same problems discussed above with respect to the bore-hole apparatuses, namely, a fixed and narrow homogeneous region to which imaging is limited, and the low magnetic field values characteristic of homogeneous magnetic field configurations.

The main reason why the above-mentioned apparatuses, as well as most all NMR or MRI setups, prefer operation with a substantially homogeneous static magnetic field, is that such a setup allows operating in a narrow frequency bandwidth (typically a few Hz). Working in a narrow frequency band allows easier electronic circuit design for tuning and matching the receiver and transmitter channels, but, most importantly, it results in low noise or, rather, high signal to noise ratio (SNR) per NMR signal (spin-echo, for example). Since the field is substantially homogeneous, the duration of the NMR signal is typically a few milliseconds. The down side of this conventional scheme of working in homogeneous fields is that field homogeneity is hard to achieve over extensive volumes, especially for "inside-out" apparatuses.

SUMMARY OF THE INVENTION

The present invention takes an advantage of a technique described in a co-pending patent application assigned to the assignee of the present application. This technique is based on the operation in substantially non-homogeneous primary (static) magnetic field created by a probe device external to the probe in order to perform MRI of regions outside the probe, which are significantly larger than those obtainable with the prior art devices. The resulting wide bandwidth is more demanding in terms of electronic circuit and receiver/transmitter coil designs.

It is important to note that the lower SNR per spin-echo (due to large bandwidth) can be compensated for by acquiring a large number of such spin-echo signals (at least one hundred, and typically a few thousands) during one excitation series, the duration of which is roughly limited by a typical spin transverse relaxation time (known as $T_2$). This stems from the fact that each wideband echo is very short in time, when compared with a narrowband echo. This realization, together with special hardware design, enables NMR imaging and measurements over extensive regions of non-homogeneous static magnetic fields.

The present invention is aimed at designing a novel probe device and an imaging method utilizing the same, characterized by operation with substantially non-homogeneous primary magnetic field, for use in MRI systems. The probe of the present invention is a fully autonomous intra-cavity MRI probe, comprising all components necessary to allow magnetic resonance measurements and imaging of local surroundings of the probe, obviating the need for external magnetic and electromagnetic field sources.

One of the suitable applications of the invented probe is the imaging of blood vessel walls. The imaging probe in such application is preferably integrated in an intravascular catheter, which is connected to an external imaging console.

The imaging method according to the invention is based on the creation of substantially non-homogeneous primary magnetic field (e.g., by permanent magnets), and the use of wideband reception and transmission channels, as well as specifically designed excitation pulse sequences. The present invention enables to achieve high SNR (similar to that of the conventional technique) by accumulating a large number of wide-bandwidth short duration echoes, in a similar overall acquisition time.

For the purpose of better understanding the imaging method according to the present invention, the following should be defined:

The term "region of interest" (ROI) signifies a region of the medium to be imaged. For intravascular applications, ROI is typically a segment of the blood vessel wall, extending 360 deg in circumference, a certain "penetration" distance radially into the vessel wall, and a certain length along the vessel.

The ROI may be formed by a plurality of locally adjacent cross-sectional slices, the so-called "imaging slices", having different positions along the length of the blood vessel (i.e., longitudinal axis of the probe).

Each slice may be further divided into angular imaging sectors. Each sector may be imaged, as will be explained in detail, by a sequential excitation and signal reception from a set of sub-regions thereof, each set covering an imaging sector.

There is thus provided according to one aspect of the present invention, an imaging probe for use in an MRI system, the probe comprising:

(a) a first magnetic field source for creating a primary, substantially non-homogeneous, static magnetic field in a region of a medium outside the probe;

(b) a second magnetic field source for creating an external time-varying magnetic field, the second magnetic field when being applied to said region, is capable of exciting nuclei in an extended sub-region of the medium to generate NMR signals;

(c) a receiver for receiving the NMR signals and generating data indicative thereof.

In order to image the ROI, the probe is placed in the medium such that the static magnetic field region created by the first magnetic field source outside the probe is located within the region of interest.

Preferably, the first magnetic field source comprises a pair of permanent magnet assemblies spaced-apart from each other along the probe axis (Z-axis), wherein the assemblies are magnetized in the opposite directions along an axis perpendicular to the probe axis (X-axis). The primary magnetic field is preferably created in only a sector of the imaging slice, defined as the imaging sector, and in this sector the field is substantially parallel to the Z-axis, and its strength decreases monotonously and substantially as one moves along the X-axis away from the probe edge, and therefore can be characterized by a substantial field gradient along the X-axis. For example, this gradient can be about 30 T/m within an imaging sector of about 2 mm's in the radial dimension.

It should be understood that the non-homogeneity of the primary magnetic field along the X-axis will result in short NMR signals (typically spin-echoe signals), namely, significantly shorter than those obtained with the prior art devices operating within the region of substantially homogeneous primary field. For example, a conventional spin echo may have duration of a few tens of milliseconds, while the spin echoes created by said probe may be only a few microseconds wide. This allows the acquisition of a few thousands of spin-echo signals in one excitation series having duration of a typical transverse relaxation time ($T_2$). Accordingly, the averaging of such a great number of signals enables to increase significantly a signal-to-noise ratio in the final signal to be analyzed. The SNR compensation achieved by averaging, therefore, enables the operation with the non-homogeneous primary field, which can correspond to a frequency bandwidth of more than 1% of the mean value of a magnetic resonance frequency of nuclei, but which can go as high as almost 200% of mean frequency value. For example, the above X-gradient primary field (30 T/m) corresponds to a magnetic resonance frequency range of 3.5 MHz to 6 MHz, i.e., a bandwidth to center frequency ratio of about 50%.

The time-varying magnetic field created by the second magnetic field source (which is formed by at least one RF coil) his sufficiently high intensity and sufficiently wide frequency band, such that it is capable of efficiently and simultaneously exciting nuclear spins to generate NMR signals characterized by NMR frequency bandwidth of more than 1% (generally, 5%–200%, typically about 10%) of their mean frequency value. Since, as stated above, the magnetic resonance frequency range of 3.5 MHz to 6 MHz (a difference of 2.5 MHz) corresponds to a bandwidth to center frequency ratio of about 50% then a 5% frequency bandwidth corresponds to 250 kHz. It should be understood that the term "simultaneous excitation" signifies excitation by a single pulse. Accordingly, the receiver has also sufficiently high sensitivity and sufficiently wide frequency band, similar to that of the transmitting coil.

Preferably, the at least one RF transmitting coil is a flat solenoid mounted on the probe edge such that the axis of the solenoid coincides with the X-axis.

For obtaining two-dimensional images of an imaging slice in the region of interest, a third magnetic field source may be used for creating the so-called "φ-gradient", which corresponds to an angular coordinate varying magnetic field. Preferably, this third magnetic field source includes a pair of parallel RF solenoidal coils, which are arranged such that their axis are parallel to the Z-axis, and located in the probe itself and close to the probe edge.

The φ-gradient may be created by a magnetic field of approximately linear dependence on the angle in the imaging sector, and can be activated in the imaging sequence. Gradient coil activation can be done in several ways. One alternative is to use double polarity gradient pulses before and after each spin echo, i.e., a positive gradient pulse before echo acquisition, and a similar but opposite (negative) pulse after the echo. In this case, the echo signal is phase-encoded in the angular dimension, and then corrected to the original phase following each echo. By varying the strength or duration of each pair of gradient pulses, while a static radial gradient (along X-axis) exists, a complete scan of K-space can be obtained.

When the imaging of a sector is completed, the probe can be rotated around its axis (Z-axis) in order to image other sectors in the same slice, thereby covering the entire imaging slice. Data obtained from the entire acquisition procedure can be processed in real-time and a two-dimensional image can be reconstructed and displayed on a PC monitor.

In order to create a three-dimensional image of the region of interest, the probe can be moved along the Z-axis or along a channel (if for example the latter is a curve-like). Alternatively, multiple probes can be aligned along the Z-axis, or along a curved-like channel.

According to another aspect of the present invention, there is provided an imaging probe for use in an MRI system, the probe comprising:

a first magnetic field source for creating a primary, substantially non-homogeneous, static magnetic field in a region of a medium outside the probe;

a second magnetic field source for creating an external time-varying magnetic field having intensity and frequency range such as to, when being applied to said region, efficiently and simultaneously excite nuclear spins to generate NMR signals characterized by NMR frequency bandwidth of more than 1% of their mean frequency value; and a receiver for receiving the NMR signals and generating data indicative thereof;

the probe thereby enabling acquisition of up to a few thousands of spin-echo signals in one excitation series that has a duration of a typical transverse relaxation time ($T_2$).

According to yet another aspect of the present invention, there is provided an imaging system comprising an intravascular magnetic resonance imaging catheter and a complementary external console associated with electronics for generating transmitted signals and processing received signals, the catheter comprising a fully autonomous imaging probe mounted at the distal end of the catheter for imaging a region of interest surrounding the distal end of the catheter, wherein the probe is characterized by the above features (a) to (c).

The electronics mainly includes the following elements: an electronic module for tuning the receiver channel and matching it to the receiver coil, and for pre-amplifying the NMR signal received by said receiver coil, a module for matching transmission channel to the second magnetic field source, a high-power amplifier for amplifying the transmission pulses to the required high voltage/current, a gradient generator unit for generating gradient field pulses at the required levels, and an external unit for further amplifying the pre-amplified received NMR signal.

The system also comprises a connector unit for connecting the intravascular catheter to the external console, both mechanically and electrically. A motor unit is provided for rotating the imaging probe about its axis in order to create two-dimensional images, and preferably also for moving the probe along its axis in order to obtain three-dimensional images of segments of the ROI (i.e., successive imaging slices) in the blood vessel wall.

The external imaging console comprises preferably a personal computer (PC) with installed hardware for producing analog transmission signals, for recording digitally the NMR received signals, for processing the signals into images, and for displaying the obtained images on the PC monitor.

When the catheter connected to the external imaging console is inserted into the blood vessel, the position of the probe is monitored by available equipment in the catheterization or operating room, such as X-Ray angiography. When the imaging probe is located adjacent to a vessel wall segment, which needs to be imaged, the operator initiates the imaging process via the imaging console controls.

The acquisition of images of the region of interest is enabled by the following: The first magnetic field source creates a primary static non-homogeneous magnetic field having a sufficient strength in the region of interest (around $\frac{1}{10}$ Tesla) outside the probe. This magnetic field region can be visualized as a sector of a plane perpendicular to the catheter axis (imaging slice). The second magnetic field source is used to excite the nuclei located in a sub-region of said sector of the imaging slice, while the receiver is used to receive the NMR signal (typically an echo-signal) produced by the nuclei.

In order to produce a two-dimensional image of the imaging slice-, two magnetic field gradients are used: The first gradient is generally radial in direction, and is inherent in the static magnetic field profile, which generally drops substantially in strength when moving away from the probe edge. The second gradient is time-dependent and is generally directed perpendicularly to the radial gradient, i.e. the angle direction. The time varying gradient is preferably produced by a pair of parallel solenoidal coils, located in the probe itself and close to the probe edge.

A sequence of excitation pulses, preferably a multiple spin echo sequence, such as the well known CPMG, is transmitted by the second magnetic field source. This sequence has the advantage that a large number of spin-echoes can be recorded during a time frame of signal coherence, even at substantial gradients of the static and RF fields. Excitation of nuclei within the sector-shaped region is preferably done by dividing this region into sub-regions, such that each sub-region includes nuclei corresponding to a narrower resonance frequency band, as compared to that of the entire sector-shaped region. Different sub-regions of the sector-shaped region are generally located at different radial distances from the probe edge. Therefore, in order to excite a specific sub-region, the carrier frequency of each transmission pulse burst generated by the second magnetic field source is determined according to the specific resonance frequency of the nuclei residing in that sub-region. By stepping the carrier frequency from one pulse burst to the next, the entire sector-shaped region at the current location of the probe can be scanned. Using extremely short pulses of sufficient power allows each sub-region to be substantially wide, meaning that a single pulse can excite nuclei in a substantially wide radial distance. Therefore, an image of the entire sector-shaped region can be acquired by a few pulse bursts, and by rotating the probe the entire imaging slice can be scanned and imaged.

The NMR signal received in each spin echo can be readily transformed into a one-dimensional density profile (neglecting NMR relaxation and diffusion effects) of the nuclei in the excited sub-region, along a radial vector. This is because each echo is acquired under a static (inherent) radial field gradient.

For obtaining two-dimensional images, the angular gradient coils, which create a magnetic field of approximately linear dependence on the angle in the imaging sector, can be activated in the imaging sequence. Gradient coil activation can be done in several ways, as will be obvious to the artisan. One option is to use double polarity gradient pulses before and after each spin echo, i.e. a positive gradient pulse before echo acquisition, and a similar but opposite (negative) pulse after the echo. This way the echo signal is phase-encoded in the angular dimension, and then corrected to the original phase following each echo. By varying the strength or duration of each pair of gradient pulses, while a static radial (read-) gradient exists, a complete scan of K-space can be obtained. When imaging of a sector-shaped region is completed, the probe can be rotated around its (and the catheter's) axis in order to image other sectors, therefore covering the entire imaging slice. The data obtained from the entire acquisition procedure can be processed in real-time and two-dimensional images can be reconstructed and displayed on the PC monitor.

In order to create a three-dimensional image, the probe can be moved along its axis, or alternatively, multiple probes can be located along this axis, covering simultaneously a long vessel segment.

The probe is further connected to the electronic module, which is preferably located in proximity to the probe itself. The electronics module is used to amplify the received signal up to a point where further noise or interference accumulated along the way becomes negligible. The electronics module also comprises basic tuning and matching components of the receiver channel, along with protection components at receiving pre-amplifier inputs. Additional wires connect the probe to following modules of both receiver and transmission channel, which do not have to be located in proximity to the probe. For intravascular applications, it is possible to locate only the probe, pre-amplifying (electronics) and matching capacitor modules in the catheter (which is usually limited in diameter). All other system modules can be located externally to the body and, therefore, with fewer constraints.

The external modules operate in the following way: The pulse sequence is generated in the PC using digital to analog hardware. The analog transmission pulses are amplified by the high power amplifier and driven into the transmission coil inside the catheter via the interface unit and transmission tuning capacitor. The NMR signals received by the receiver coil are pre-amplified by the pre-amplifying unit in the catheter and then by additional amplification stages outside the catheter. The analog received signal is digitized in the PC and acquired into memory. It is then processed in order to give a full two- (or three-) dimensional image, which is displayed on the PC monitor. The pulse sequence generated by the PC also controls gradient field pulse generation using the gradient generator module.

According to yet another aspect of the present invention, there is provided an imaging method for creating an image of a region of interest, the method comprising the steps of:
(i) creating a primary, substantially non-homogeneous, static magnetic field in the region of interest;
(ii) creating a time-varying magnetic field within an extended sub-region of the region of substantially non-homogeneous static magnetic field, wherein said time-varying magnetic field has intensity and frequency band such as to simultaneously and effectively excite nuclei in the sub-region to generate NMR signals characterized by NMR frequency bandwidth of more than 1% of their mean NMR frequency value;
(iii) receiving the signals and generating data indicative thereof.

The main conceptual novelty of this invention is that the imaging probe utilizes a substantially non-homogeneous magnetic field, which may be produced either externally or internally to the field sources, as its static magnetic imaging field. In addition, the imaged region (sector) of the region of interest (ROI) is substantially extensive, relative to the dimensions of the field sources in general, or, when the sources are contained in an imaging probe, relative to the dimensions of the imaging probe. The combination of these two requirements means that both hardware characteristics and imaging method, which are part of the disclosed invention are very unique and non-conventional in the context of ordinary MRI. These characteristics include inter alia the following:

A design of both transmission and receiver channels, so that they can operate in a simultaneous wide band of frequencies.

A design of an extremely sensitive receiver channel, including an extremely low noise pre-amplifier, matched to a sensitivity-optimized coil over a wide frequency band. The requirement for high sensitivity stems from the requirement to overcome the high noise levels characterizing the wide frequency band.

A design of imaging sequences utilizing the short echo duration, again—following the wide frequency band. The short echo duration allows averaging of thousands of echoes in a single coherence duration ($T_2$) of a few tens of milliseconds. This allows averaging and, therefore, a significant improvement in the final SNR.

It is important to note that according to the invention, the static magnetic field source itself serves as a means for creating a magnetic field gradient to image the region of interest along one dimension thereof. A gradient creation means are typically utilized in an MRI system, and always as a separate element, in addition to static and time-varying RF magnetic field sources.

Thus, according to yet another aspect of the present invention, there is provided an imaging probe for use in an MRI system, in which an image of a region of interest in a medium along it least one dimension of said region is created by utilizing a means for producing at least a first magnetic field gradient along said at least one dimension, the imaging probe comprising:
a first magnetic field source for creating a primary static magnetic field in the region of interest;
a second magnetic field source for creating an external time-varying magnetic field to exciting nuclei in an extended sub-region of the medium to generate NMR signals; and
a receiver for receiving the NMR signals and generating data indicative thereof;
wherein said primary static magnetic field created by the first magnetic field source is substantially non-homogeneous, said first magnetic field source thereby operating as the means for creating the first magnetic field gradient.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
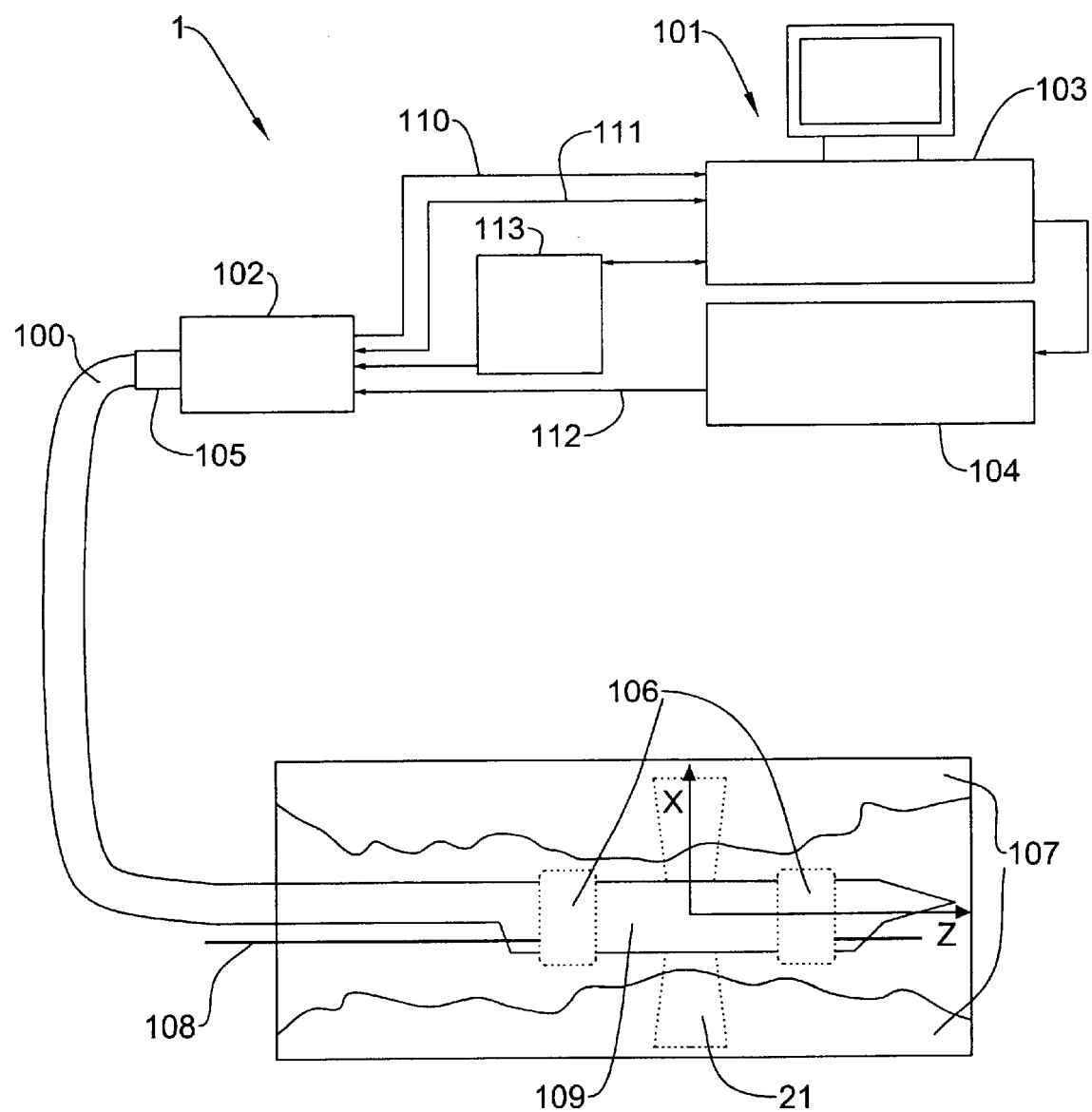
FIG. 1 is a schematic illustration of an MRI system according to the invention.

Referring to FIG. 1, there is illustrated an MRI-based system for intravascular imaging, generally designated 1, utilizing an intravascular catheter 100 that comprises an imaging probe section at the distal end 109 of the catheter, and optionally two inflatable balloons 106. The catheter 100 is brought to a region of interest by "riding" a pre-positioned guide-wire 108. This is a known procedure in interventional cardiology, and therefore need not be described in detail, except to note the following. To fix the relative position of the distal end of the catheter 109 relative to surrounding blood vessel walls 107, the balloons 106 are inflated until sufficient contact is achieved between the balloons 106 and the blood vessel walls 107. The positioning and operation of the imaging probe (which is not specifically shown here) located internally in the imaging probe section of the catheter 100 permits imaging of a disk-shaped slice 21 (which is a cross-section of the region of interest) surrounding the imaging probe in the XY-plane that intersects the vessel walls 107.

A produced image at each current location of the center of probe section 109 with respect to Z-axis is a two dimensional cross-section (in the XY-plane) of the vessel walls 107. The balloons' positions are designed such that the shape distortion at both distal and proximal planes of contact with the wall has a negligible effect on the original wall morphology at the imaging slice 21.

It should be understood that the use of balloons 106 is one possible solution for stabilizing the relative position of the probe section 109 with respect to vessel walls 107 during the image acquisition (of the order of tens of seconds). The balloons 106 may be of an annular shape that allows continuous circulation of blood therethrough, both during the image acquisition phase and at all other time periods. Lumens can be provided through or adjacent to the probe section 109, and the imaging probe section 109 may include several inner liquid passageways to permit passage of various liquids, e.g., a contrasting agent, as well as through-flow of blood. All these techniques are known per se, and therefore need not be specifically described.

Obviously, alternative techniques can be used for fixing the probe section 109 relative to tie vessel walls 107, such as a flexible catheter tip or side-arms (not shown) to push the probe section 109 against the vessel walls 107 and even to move the position of the probe section 109 while touching the vessel walls so that it follows the contour of the walls while scanning the imaging slice. In addition or as an alternative means, it is possible to correct motion effects by either hardware or software means.

The imaging probe itself, as well as other internal catheter parts (not shown here), are connected to an interface unit 102 external to the body. This is implemented by a connector 105 provided at the proximal end of the catheter 100.

When the mechanical rotation of the imaging probe is required (e.g., when a circumferential image of the entire imaging slice is needed) the interface unit 102 may include a motor drive (not shown) for rotating the imaging probe at the distal end of the catheter around the Z-axis, using an internal torque transferring cable (not shown). Alternatively, a miniature motor can be located at the distal end of the catheter itself. In such case, the interface unit 102 may include the driving circuitry for the miniature motor. Some of the electronic modules typically used in the imaging system, such as amplification circuits for a receiving channel, matching networks for the transmission/receiving channels, etc., may be incorporated in the interface unit 102.

The system 1 is further provided with an external imaging console, generally designated 101 connected to the interface unit 102 via a power and control cable 111 and via reception and transmission channel segments 110 and 112. The external imaging console 101 comprises such main constructional parts as a desktop personal computer (PC) 103 and a high-power transmission amplifier 104. The PC 103 controls the synchronized transmission pulse generation, signal acquisition, imaging probe rotation and $\phi$-gradient activation, all being involved in the imaging process, as will be described further below. In addition, the PC 103 is used as a control station through which an operator interfaces with the system 1, and for displaying the image.

Figure 2:
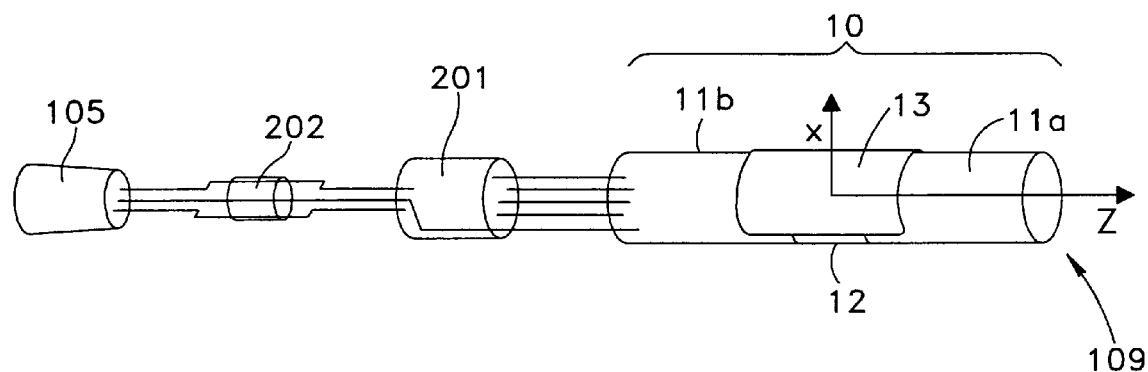
FIG. 2 more specifically illustrates the internal parts of a catheter used in the system of FIG. 1.

FIG. 2 more specifically illustrates the internal parts of the imaging catheter 100. Located at the distal end 109 of the catheter is the imaging probe 10, which is electrically connected to an electronic module 201. The imaging probe comprises such main constructional parts as two permanent magnets 11b and 11a (constituting together a first magnetic field source) located at proximal and distal parts of the probe 10 with a gap between them. In the present example, the permanent magnets 11b and 11a have a cylindrical shape. A coil block 12, including a receiver coil and gradient coils (not shown), is located in the gap. The construction and operation of the coil block 12 will be described more specifically further below. A transmission coil 13 (constituting a second magnetic field source) is attached adjacent to the coil block 12 and its external surface is shaped as a curved rectangle. The coil 13 is mounted such that its geometrical center coincides with the X-axis, and therefore faces an imaged sector (not shown), as will be described further below.

The electronic module 201 contains electronic components required for tuning/matching of the reception channel and for pre-amplifying the NMR signal received by the probe 10. The pre-amplifying components should preferably be located proximate to the receiving coil block 12, in order to minimize effective noise and interference levels. Therefore, the electronics module 201 is typically located 10 cm away from the probe 10.

Figure 3:
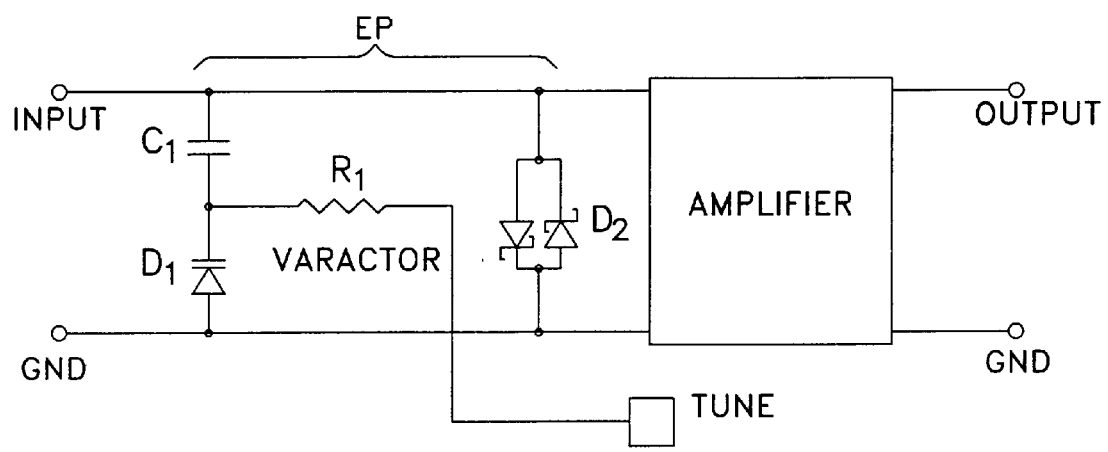
FIG. 3 is a block diagram of a preamplifier used in the system of FIG. 1.

FIG. 3 illustrates a block diagram of main components of a miniature wide-band electronic preamplifier EP constructed and operated according to the invention. The preamplifier is connected directly to the leads of a receiver antenna (coil), to amplify an input signal from the receiver antenna, and covers the bandwidth of 1–10 MHz. As shown, the input from the receiver antenna is placed in parallel with varicap diode $D_1$, the capacitance of which changes with the DC voltage applied thereto (the so-called "tune voltage"). This enables a quick change in the parallel resonance of the L-C circuit, wherein L is the inductance of the antenna and C is the capacitance of the varicap diode $D_1$. This gives the maximum voltage at frequency $f=\frac{1}{2}\pi\sqrt{LC}$. The voltage appearing on this parallel pair is fed directly to the FET amplifier whose output is matched to the next stage amplifier (not shown) already outside the body of the patient. As for the other components, a capacitor $C_1$ serves to choke DC tune voltage in the input of the amplifier. Diode pair $D_2$ serves to protect the input of the amplifier from high voltage.

Both the electronic module 201 and the probe 10 are rigid internal parts of the catheter 100. However, only the probe 10 should be located adjacent to the imaging slice 21 (FIG. 1), which is typically located in a narrow part of the blood vessel. Spacing the electronic module 201 a distance of 10 cm from the probe, allows better maneuverability of the probe 10 into narrow vessel segments, while not substantially sacrificing the overall reception signal-to-noise ratio (SNR).

Further provided in the catheter 100 are a capacitor module 202 and a connector 105 to the external interface unit (102 in FIG. 1). The capacitor module 202 is used for matching the transmission channel network. The physical separation between the electronic module 201 and these components, i.e., the capacitor module 202 and the connector 105, is effectively unlimited, i.e., about 1–1.5 meters, depending on catheter requirements.

Figure 4:
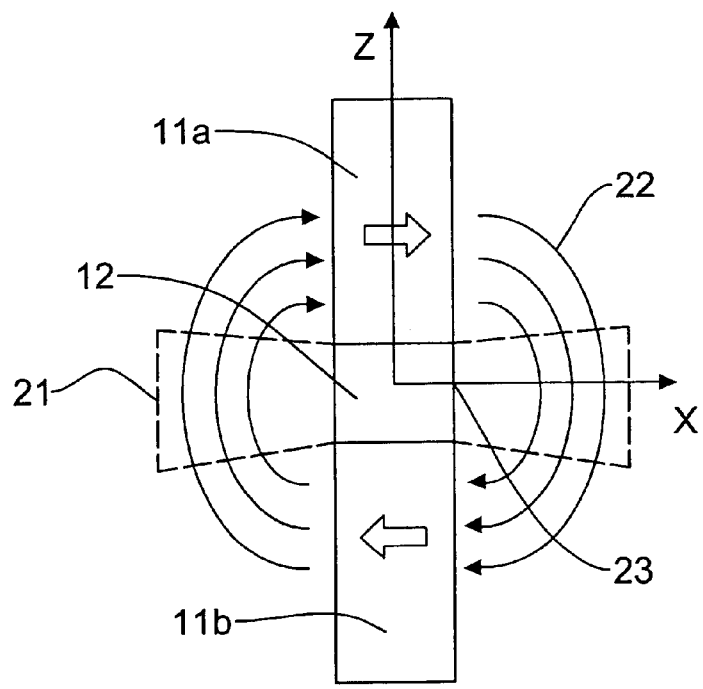
FIG. 4 illustrates a cross-section of the imaging probe shown in FIG. 2.

As better shown in FIG. 4, illustrating a cross section of the probe 10 in the XZ-plane (where the transmission coil 13 is not shown for simplicity), the permanent magnets 11a and 11b are magnetized along the X-axis, i.e., perpendicularly to the Z-axis, and in opposite directions to each other. More specifically, the N- and S-poles of the magnet 11a face the S- and N-poles of the magnet 11b, respectively. The magnets 11a and 11b create a primary static magnetic field $B_0$ with flux lines 22 forming closed loops between the magnets. In proximity to the X-axis, the flux lines 22 are directed substantially in the +/−Z direction. The volume (region) surrounding the probe 10 in which the flux lines 22 are directed substantially in the +/−Z direction is defined as the imaging slice 21 (i.e., a sector of the region of interest).

Figure 5:
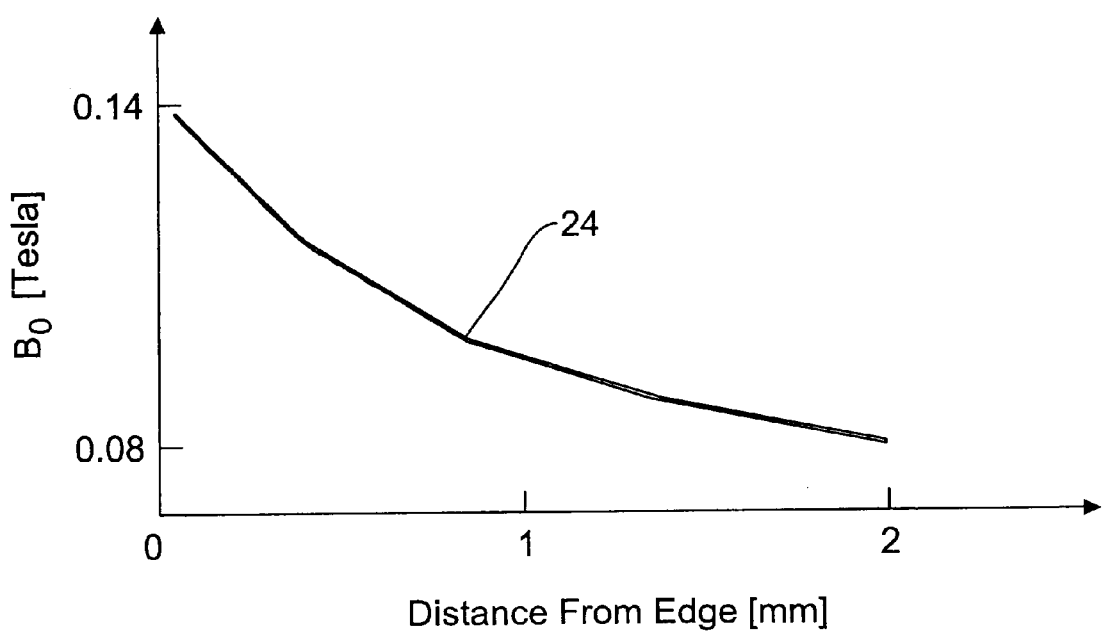
FIG. 5 illustrates the profile of the Z-component of a primary static field along the X-axis.

FIG. 5 illustrates the profile of the Z-component of the primary static magnetic field, $B_0$, along the X-axis (i.e., radial direction with respect to the center of the probe). This profile corresponds to an example of the imaging probe of a 2 mm diameter. The distances along the X-axis are measured from the probe edge (23 in FIG. 4).

As shown, the static field strength decreases significantly with the increase of the distance from the probe edge 23. Within the distance of 2 mm, the field decreases by about 50%, creating a substantial static magnetic field gradient $\partial B_z/\partial x$ of approximately 30 T/m.

It should be noted that, generally, such a 50% decrease of the field can be obtained within a distance, which is similar to transverse dimension of the probe (i.e., the probe's diameter in the present example of the cylindrically-shaped probe 10). For example, a 6 mm diameter probe creates a static field which drops to 50% of its peak value at around 6 mm away from the probe edge. This characteristic of the $B_0$ field is essentially different from that used in the prior art NMR techniques, where typical gradient values are a few Gauss/cm or about 0.05 T/m. The consequences of such non-homogeneity of the primary magnetic field, and the methods by which it can be used as an advantage, will be described further below.

It should be understood that, generally, the exact field profile 24 is a complex function of several parameters, such as magnetic material of which the magnets 11a and 11b are made, their exact shape and size, the size of the inter-magnet gap, etc. The permanent magnets 11a and 11b can be made of a rare-earth magnetic material. In the present example, NdFeB (Neodymium Ferrite Boron) is used, which enables to create a substantially strong static field in the imaging slice 21.

It should be noted that the permanent magnets 11a and 11b and the coil block 12 may have geometrical shapes other than cylinders. A single permanent magnet, as well as more than two such magnets can theoretically be used to construct a primary field source. The magnetic field source assembly can utilize a soft ferromagnetic material in order to increase field intensity. Generally speaking, any permanent-magnet or electro-magnet based static field source can be used as a primary field source, as long as a static magnetic field of sufficient strength is created in the imaging slice 21.

Figure 6:
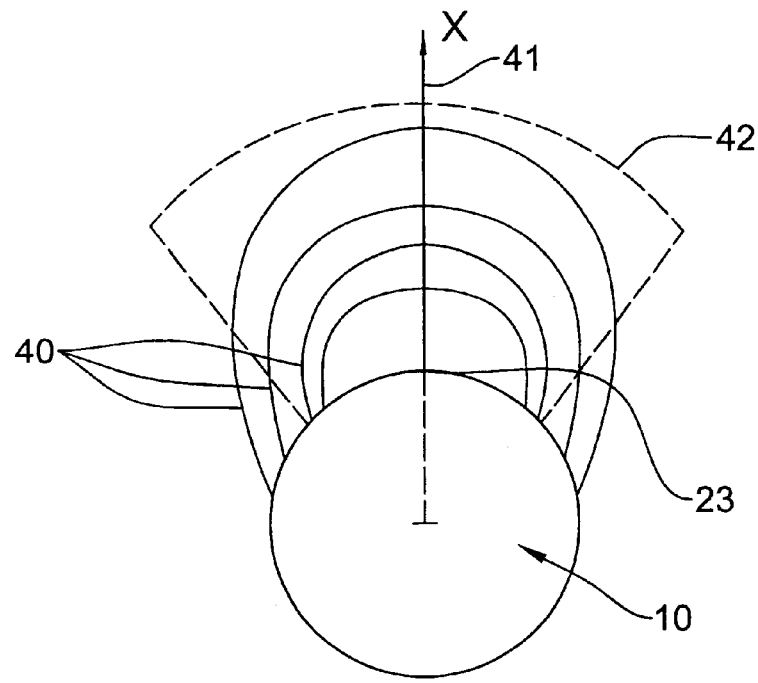
FIG. 6 illustrates the contour pattern of a static magnetic field created by the probe in the XY-plane.

FIG. 6 illustrates the static magnetic field pattern in the XY-plane in the vicinity of the imaging slice sector 42 shown as contour lines 40 delineating regions of equal Z-component of $B_0$. Here, the imaging sector 42 actually presents a portion of the imaging slice at one side of the probe, i.e., within areas along the positive X-axis 41. The X-axis 41 forms a symmetry axis for both the field pattern and for the imaging slice sector border 42. Stronger field regions are located near the intersection of the X-axis 41 and the probe edge 23, while weaker field regions are located further away from the probe edge 23. The regions of stronger field are concentrated within the paraxial regions of the X-axis (as compared to periphery regions thereof), making the X-axis a preferable imaging axis.

Figure 7:
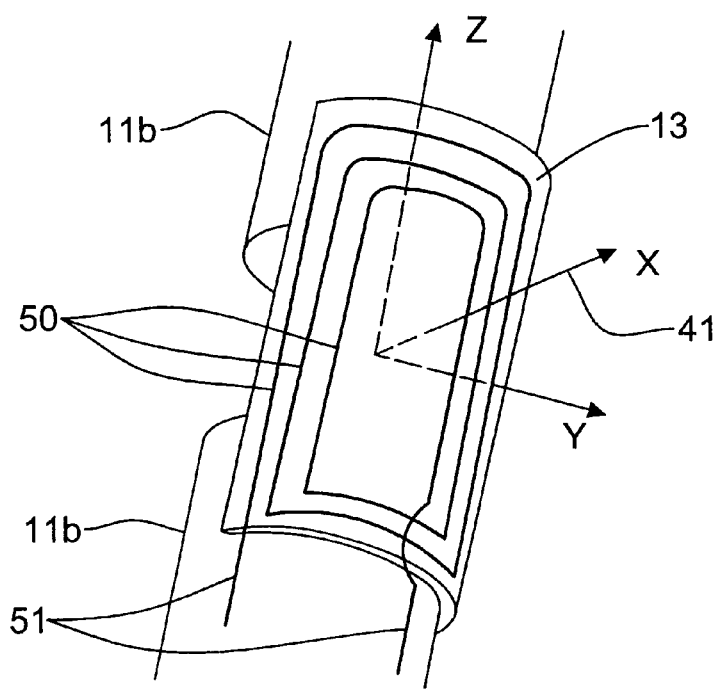
FIGS. 7 to 9 illustrate the construction and operation of a transmission coil of the probe.
Figure 8:
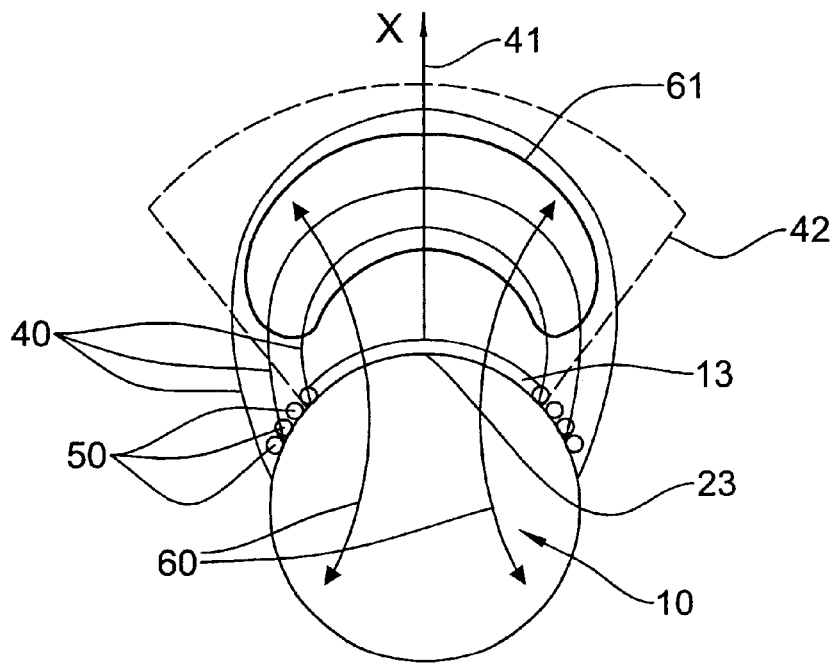

Referring to FIGS. 7 and 8, the construction and main operational principles of the transmission coil 13 are illustrated. The coil 13 is formed by winding a conducting wire in a flat pattern of windings 50, or printing a spiral conductor pattern, and then folding it to form a curved rectangle. This transmission coil 13 is then attached to the probe 10 while its geometrical center coincides with the X-axis 41. When current is driven through coil leads 51, and consequently, through the coil windings 50, a time-varying magnetic field $B_1$ is created, as shown by flux lines 60 (FIG. 8). This $B_1$ field is directed substantially in the X-direction, and its magnitude decreases significantly when moving either away from the X-axis 41, or away from the probe edge 23 along the X-axis 41.

Nuclear spins residing in the imaging sector 42 are subject to the static $B_0$ in the Z-direction, the strength of which depends on their position in the imaging sector 42, as delineated by the contours 40 of the static field. When a radio-frequency (RF) pulse is driven into the transmission coil 13 a transverse oscillating field is created 60, which excites the spins that have a resonance frequency corresponding to the pulse frequency. If a substantially short RF pulse is used for excitation, the spins of a relatively wide band of resonance frequencies are excited, i.e., a volume of spins which extends substantially along the X-axis. The ability to effectively excite nuclei with resonance frequencies which vary substantially from the center frequency of the transmission pulse is, however, limited, and therefore the region of nuclear spins, which can be effectively excited by a single pulse, can be generally delineated as a "banana"-shaped sub-region 61.

Figure 9:
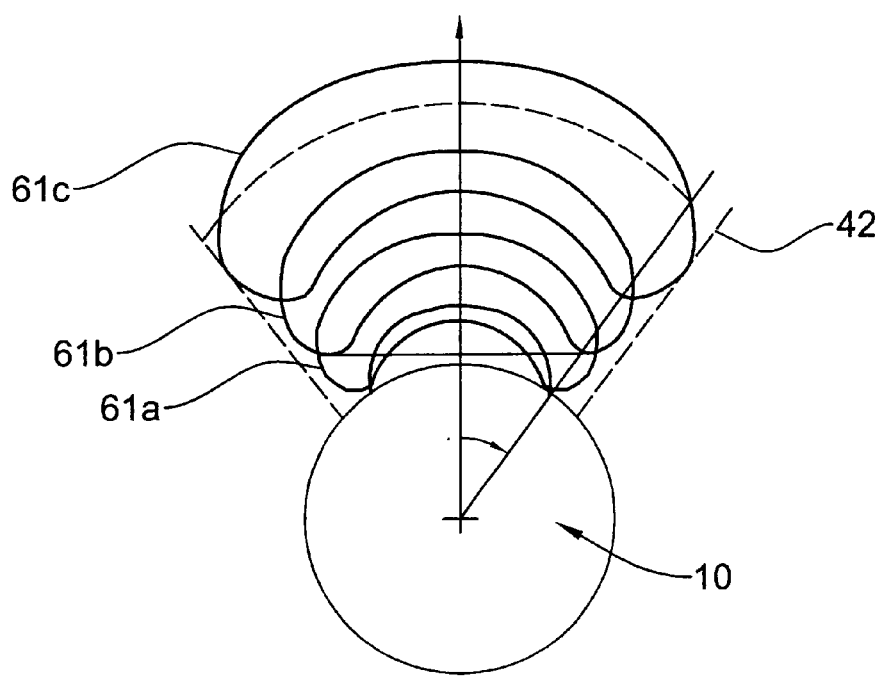

By varying the center frequency of the transmission pulse, different "banana"-shaped sub-regions of excitation can be selected: a higher center frequency pulse excites a sub-region located closer to the probe edge 23, while a lower frequency pulse excites a sub-region farther away from the probe edge 23. This is illustrated in FIG. 9, showing three banana-like sub-regions 61a, 61b and 61c sequentially activated by varying the center frequency of the transmission pulse. The pulse width (or shape in general) controls the radial extent of the sub region: A narrower pulse in the time domain will excite a wider sub-region, as long as the excitation energy of the pulse remains sufficient for the required magnetization tilt angle.

Referring back to FIG. 5, it can be deduced that in order to efficiently excite a relatively wide band of spin resonance frequencies, i.e., about 1/10 of the overall bandwidth corresponding to 0–2 mm distance from the probe edge 23, a pulse width of around 1 μsec should be used. In order to induce a 90° or 180° tilt angle, this pulse has to be extremely powerful, and the transmission coil 13 and transmission channel have to be substantially efficient over the entire bandwidth of operation. These requirements should be taken into account in the efficient geometry of the transmission coil 13, in the characteristics of coil windings 50, in the design of matching circuits for the transmission channel, and in using a high peak-power amplifier (104 in FIG. 1) as part of the imaging console (101 in FIG. 1).

Figure 10:
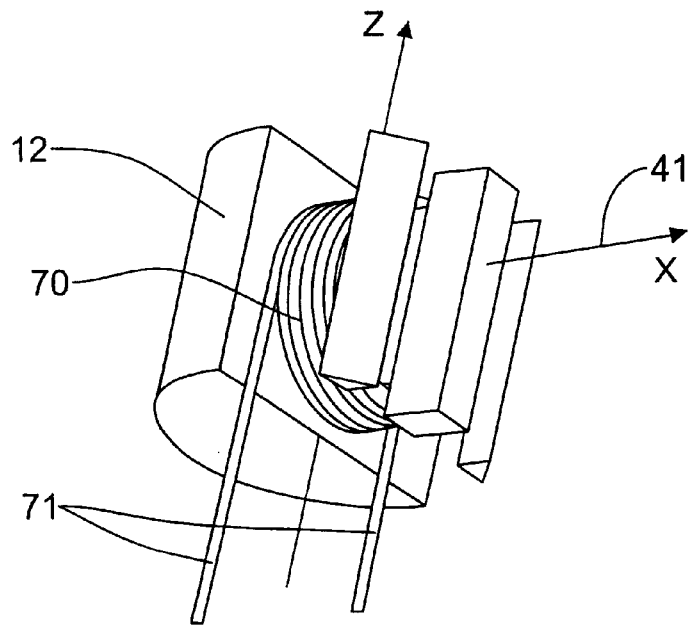
FIGS. 10 and 11 illustrate the construction and operation of a receiver coil of the probe.

FIG. 10 exemplifies the construction of a receiver coil 70 included in the coil block 12 (the gradient coils not shown for simplicity). The receiver coil 70 is wound around the central section of the coil block 12. The receiver coil 70 has a solenoid shape, and is arranged such that the axis of the solenoid is parallel to and coincides with the X-axis 41. Two receiver coil leads 71 connect the coil block 12 to the electronic module (201 in FIG. 2). The receiver coil 70 is carefully designed in order to maximize sensitivity to NMR signals to be received. The type and number of coil windings, the coil geometry and position are chosen in order to maximize its sensitivity over a wide frequency band of operation.

Figure 11:
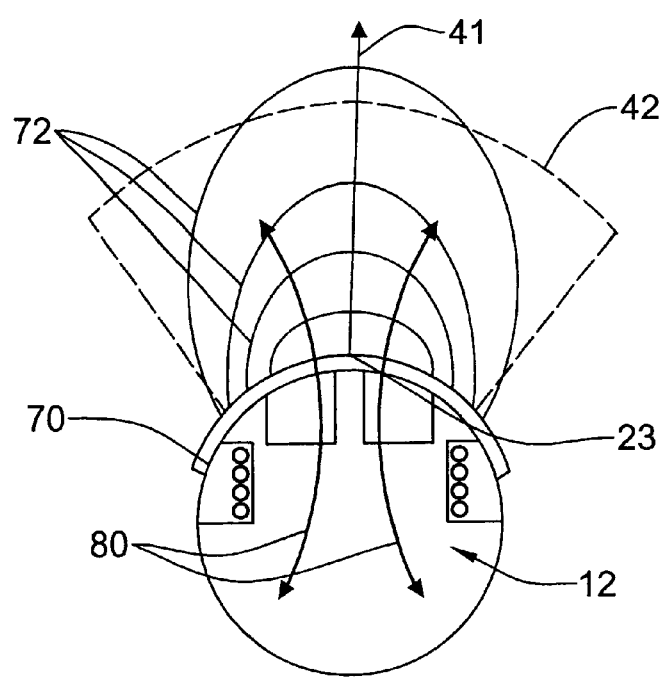

FIG. 11 shows a cross section of the receiver coil 70 wound around the coil block 12 in the XY-plane. If current were driven through the coil 70, a magnetic field would have been created having flux lines 80 generally directed along the X-axis 41. From the principle of reciprocity, an oscillating magnetization in any point in space having a component parallel to the virtual flux lines 80 at that same point will be depicted by the receiver coil 70 as induced voltage on the coil leads 71. Since virtual flux density drops with radial distance from the probe edge 23, the sensitivity of the receiver coil 70 decreases with this radial distance. The pattern of the receiver coil sensitivity in the XY-plane is shown by contour lines 72 showing the sensitivity decay with the radial distance and with the distance from the X-axis 41. These contour lines 72 are somewhat similar (although not identical) to the static field contour in the XY-plane (40 in FIG. 6).

It should be understood that the system components described above are sufficient to perform pseudo-one-dimensional imaging of samples external to and adjacent to the probe 10. This is implemented by manipulating the catheter 100 such that the probe 10 at its distal part is located adjacent to the imaged sample and such that the X-axis passes along one dimension of the sample.

Figure 12:
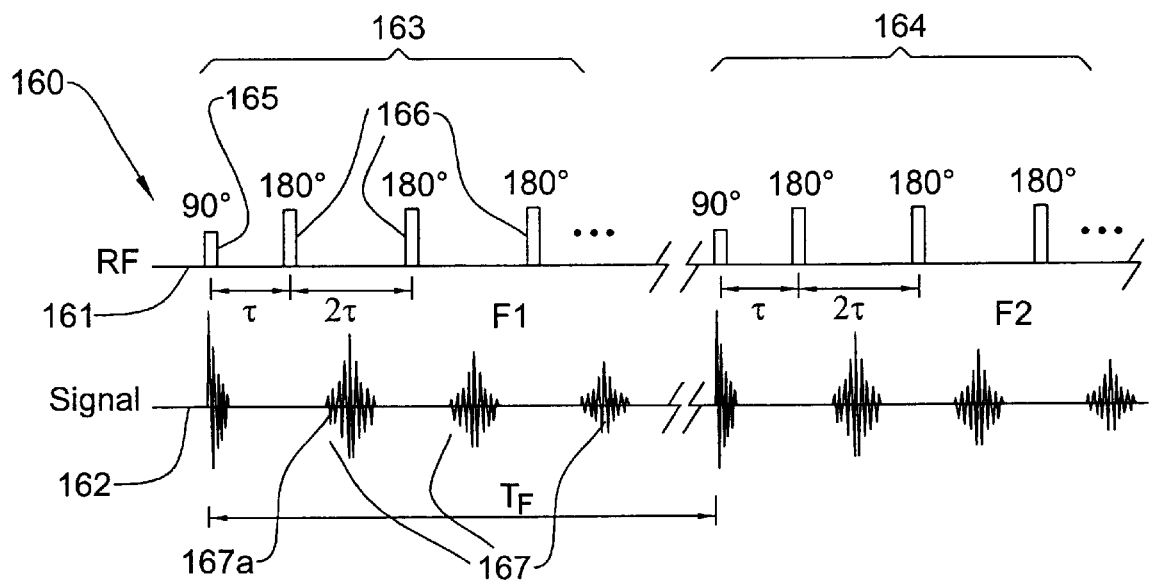
FIG. 12 illustrates the excitation scheme suitable for acquiring a one-dimensional image of a sector of the region of interest.

An example of the imaging method will now be described with reference to FIGS. 8 and 12. This method is based on a sequence of the Carr-Purcell-Meiboom-Gill (CPMG) sequence type. The terminology and graphical method used to describe this sequence is known per se, and therefore need not be specifically described. A graph 161 corresponds to the time-base envelope of the RF pulses generated by the transmission coil 13 to excite the nuclei. A graph 162 corresponds to a qualitative sketch of the expected magnetic resonance signals (echo signals).

A series 163 of wide-band (or "hard") RF pulses is preferably used to simultaneously excite nuclei in one sub-region 61 (FIG. 8) of the imaging slice sector 42, so as to obtain a series of spin-echoes 167. The position of the banana-like sub-region 61 along the X-axis is selected by setting the RF frequency of the pulses 165 and 166 to a value representing the typical resonance frequency $F_1$ of nuclear spins in that sub-region.

One possible example for obtaining the spin-echoes 167 is the transmission of a 90°-RF pulse 165 followed by a series of 180°-RF pulses 166, using the time delays τ and 2τ, respectively, shown in graph 161. It should, however, be noted that numerous other excitation schemes are applicable for obtaining a series of spin-echoes 167, and can therefore be used for the purposes of the present invention. Sequences based on magnetization tilt angles different than 90° and 180°, on stimulated echoes, and on variations in pulse timing and phase are few examples of many different sequences well known in the art, which can be used in accordance with the present invention.

The spin-spreading, which is rephased at each echo center, stems predominantly from the strong X-gradient in the static magnetic field, which exists permanently in the imaging sector 42. In the example of FIG. 5, this gradient can be estimated at around 30 T/m corresponding to a magnetic resonance frequency range of 3.5 MHz to 6 MHz for nuclei in the imaging sector 42 of a 2 mm radial dimension. Even for a single sub-region of sufficient radial extent, the simultaneous resonance frequency bandwidth can be of the order of 0.5 MHz. It is thus evident that the method according to the invention enables to simultaneously operate within a substantially wide frequency bandwidth of the magnetic resonance signals with respect to the mean frequency value. In the present example, the overall frequency bandwidth is approximately 50% of the center frequency, while the simultaneous bandwidth (corresponding to a single sub-region) may reach 5–10% of the center frequency. In general, the method and design of the different components disclosed as part of this invention, enables to successfully operate in the non-homogeneous magnetic field that corresponds to the non-conventional frequency bandwidth of more than 1%, and typically 10%, of the mean value.

It will be understood that one-dimensional (1-D) spin-density profiles of the imaging sector 42 can readily be obtained by sampling the echo signal (167a in FIG. 12, for example) using typical τ values and acquisition window sizes of several microseconds, and transforming it using the conventional Fourier transform technique. The fact that the static magnetic field profile (24 in FIG. 5) is not perfectly linear can be readily compensated for during post-processing.

The relatively short τ values make possible the acquisition of a few thousands of spin-echoes 167 in one excitation series 163, having duration of a typical transverse relaxation time ($T_2$). The multiplicity of spin-echoes 167 acquired can be averaged prior to any transformation in order to improve the signal-to-noise ratio (SNR) and, as a result, the quality of the final image.

When signal acquisition from one sub region (61 in FIG. 9) is completed, the next sub region can be acquired by repeating the above pulse burst 167 using a new pulse burst 164 with a different center frequency ($F_2$) in the transmitted pulses. By properly designing the order of excited sub-regions, and by shaping the RF pulses, the excitation of one sub-region can be such as to produce little or ineffective excitation of neighboring sub-regions. This allows for sequential excitation of sub-regions without the requirement for the period of burst repetition $T_F$ to be greater than $T_1$, or, in other words, allows for the acquisition of a complete set of sub-regions covering the entire imaging sector 42 in one $T_1$ time frame.

Several methods are available for obtaining two-dimensional (2-D) images of the imaging slice sector 42. For example, an integrated $\phi$-gradient coil can be utilized. Such a coil may be of a conventional type, for example as disclosed in the above-indicated U.S. Pat. No. 5,572,132.

Figure 13:
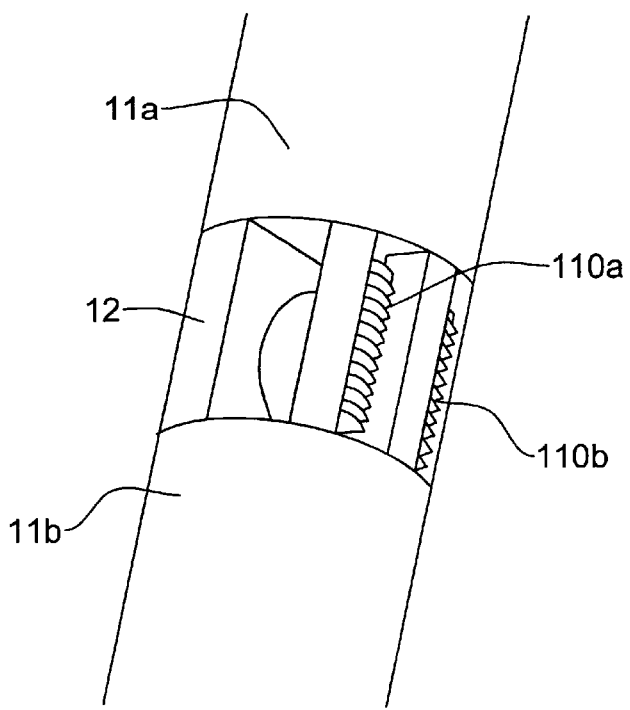
FIGS. 13 to 15 illustrate the constructional and operational principles of an angular gradient coil assembly suitable to be used in the imaging probe of FIG. 4.
Figure 14:
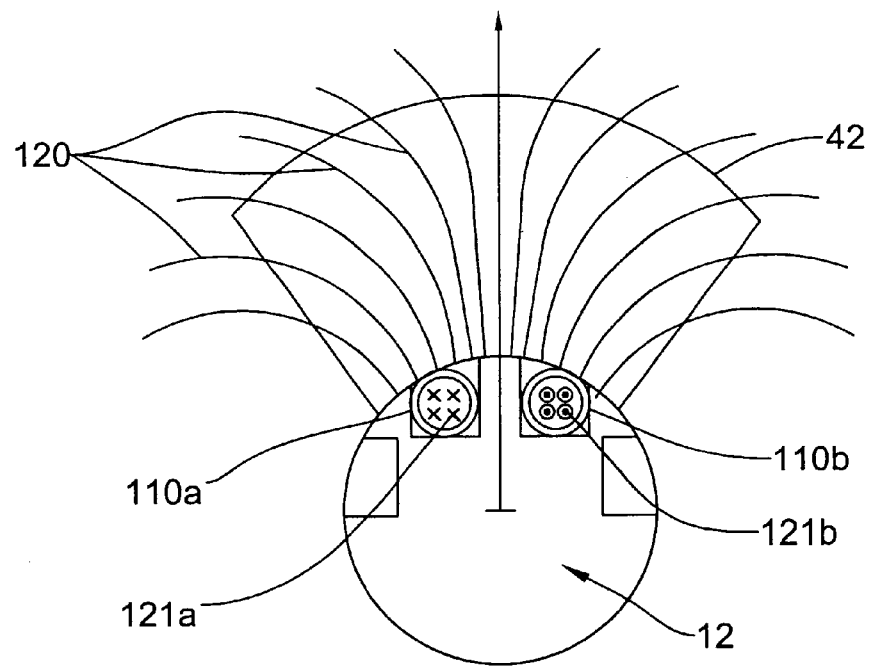

In the present example illustrated in FIGS. 13 and 14, the $\phi$-gradient coil is designed to control the gradient profile in the imaging sector 42. A gradient coil is formed by two solenoids 110a and 110b wound around two rods of ferrite material 121a and 121b. The direction of coil winding is opposed, i.e., one coil 110a is wound in a right hand helix, while the other coil 110b is wound in a left hand helix. Both coils 110a and 110b are located in the coil block 12, together with the receiver coil (not shown here for simplicity). The described gradient coil and winding geometry is anti-symmetric with respect to the X-axis, as can be seen in the cross-sectional XY-plane view of FIG. 14. The two ferrite rods 121a and 121b and wound solenoids 110a and 110b can be observed in the coil block 12 proximal to the probe edge.

It should be noted that the provision of ferrite rods 121a and 121b is optional, and is used to improve the efficiency of the gradient field by concentrating the magnetic flux lines in the solenoids, thereby improving the field intensity per unit current driven in the coils 110a and 110b.

The coil leads (not shown) are electrically connected (in series or in parallel) to the gradient generation module (113 in FIG. 1), which is part of the imaging console (101 in FIG. 1). When current is driven through the coils 110a and 110b, a magnetic field is created in the imaging sector 42, which, proximal to the XY-plane, is directed substantially in the +/−Z direction. The strength of this magnetic field is an anti-symmetric function of the $\phi$-coordinate, as delineated by the contours 120.

Figure 15:
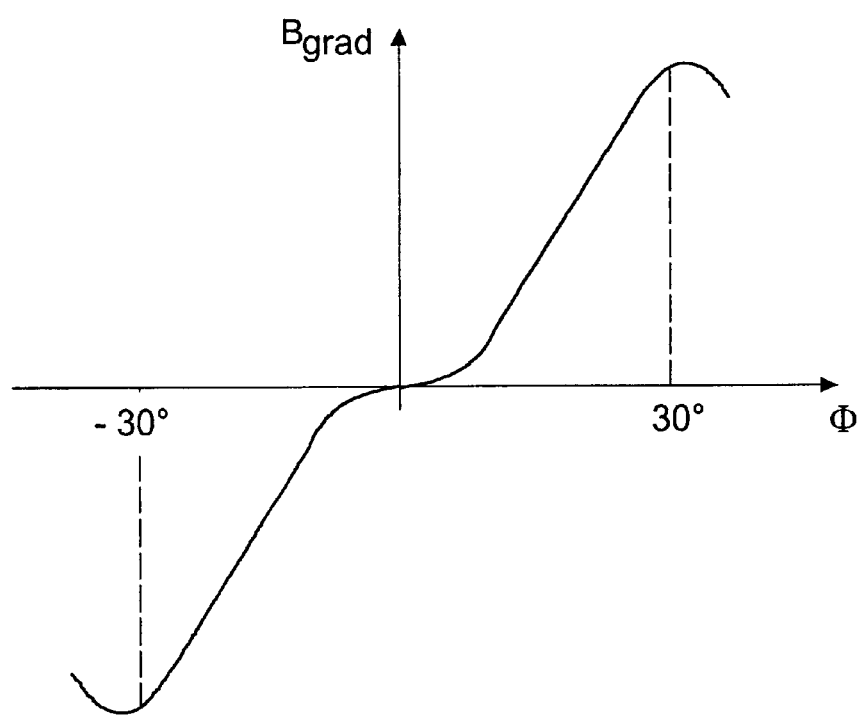

This way, a $\phi$-gradient field, $$\frac{\partial B_Z}{\partial \phi},$$

is created in the imaging sector 42. A profile of the created gradient field along the $\phi$-coordinate is illustrated in FIG. 15, showing the Z-component of the gradient field $B_{grad}$ as the function of the $\phi$-coordinate. It can be observed that over an angular sector of around 60 deg (+/−30 deg), which corresponds to the extent of the imaging sector 42, $B_{grad}$ is a monotonic and close to linear function of the $\phi$-position.

Figure 16:
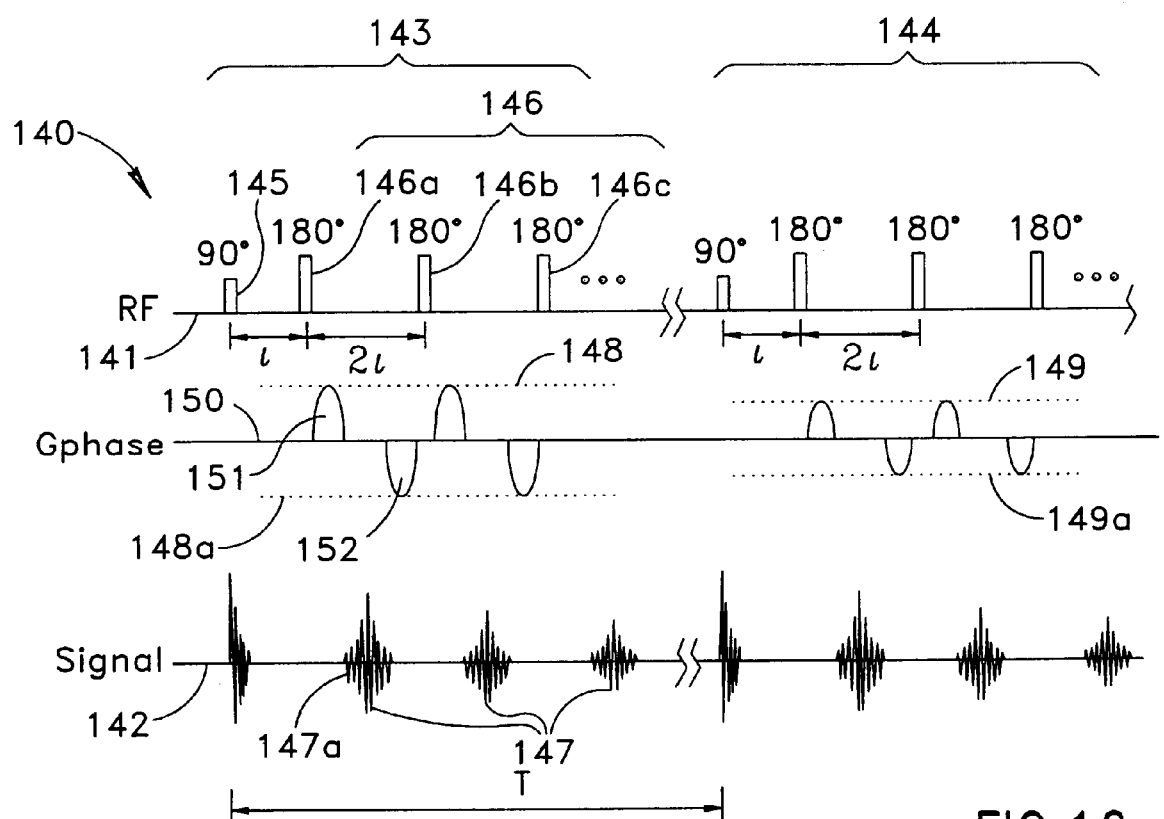
FIG. 16 illustrates the excitation scheme suitable for acquiring a two-dimensional image of an imaging slice of the region of interest.

It should be understood that a great variety of two-dimensional imaging sequences can be used in accordance with the proposed embodiment of gradient coils. One possible example of such sequence is illustrated in FIG. 16. The sequence is generally based on the above-described one-dimensional sequence of FIG. 12, namely, the transmission RF pulse envelopes 141, received signal 142 and gradient pulses 150. In the sequence outlined in FIG. 16, RF pulse bursts 143 and 144 are transmitted using the same center frequency. The center frequency can be changed in between groups of pulse bursts, as will be described below. As in FIG. 12, each RF pulse burst optionally consists of a 90°-RF pulse 145, followed by a series of 180°-RF pulses 146. In FIG. 16, only the first three 180°-pulses are shown, labeled 146a, 146b, and 146c. Gradient pulses are transmitted in pairs in between every two 180°-pulses 146, before and following each spin-echo signal acquisition segment 147. The first (positive) gradient pulse 151 follows the first 180°-pulse 146a, and phase-encodes the spins in the $\phi$-direction. The phase-encoded echo 147a is then acquired. The second (negative) gradient pulse 152 reverses the phase shifts generated by the first gradient pulse 151, prior to the next 180°-pulse 146b. The gradient pulse levels 148 and 148a remain constant throughout each pulse burst 143, and the echoes acquired during this burst can be averaged for improved SNR.

During the next pulse burst 144, the gradient pulse levels 149 and 149a are changed and the process is repeated. By repeating the process with N different (and preferably linearly varying) gradient levels, a scan of k-space in two dimensions, which are roughly the radial dimension (X-axis) and the angle dimension ($\phi$), can be achieved. By applying the two-dimensional Fourier transform with appropriate weighting and calibrations, a two dimensional image of the sample in a single sub region (61 in FIG. 9) of the imaging sector can be obtained.

Figure 17:
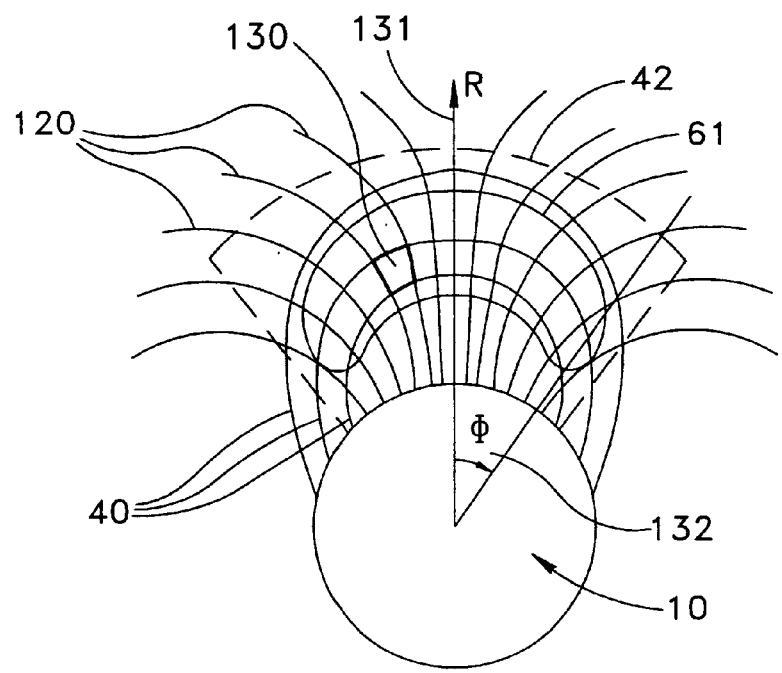
FIG. 17 illustrates a "raw" pixel in the two-dimensional image obtained with the scheme of FIG. 16.

Referring now to FIG. 17, pixels 130 in this two-dimensional image in the XY-plane are schematically illustrated. The contours of the static field ($B_0$) 40 are shown together with the contours of the gradient field 120. The pixel 130 is defined by two consecutive $B_0$ contours in the first (radial) dimension and by two consecutive gradient field contours in the second ($\phi$) dimension. This pixel is actually the so-called "raw" pixel, since it will eventually need to be translated by interpolation and calibration into more conventional polar coordinates R and $\phi$ along the axes 131 and 132, respectively.

Alternative methods for obtaining lateral ($\phi$) separation can be based on "destructive sharpening" of the sub-region 61 in the $\phi$-dimension. This effect can be achieved by using the $\phi$-gradient coil 110 design, which produces a substantial magnetic field in regions of large (absolute) $\phi$-values (FIG. 15). These substantial fields can be used for creating destructive dephasing of spin-echo components coming from nuclear spins in regions of large (absolute) $\phi$-values. Spins located at $|\phi|>\Delta\phi_0$ are intentionally dephased, in contrast to spins located at $|\phi|<\Delta\phi_0$, wherein $2\Delta\phi_0$ is the required angular resolution.

Figure 18:
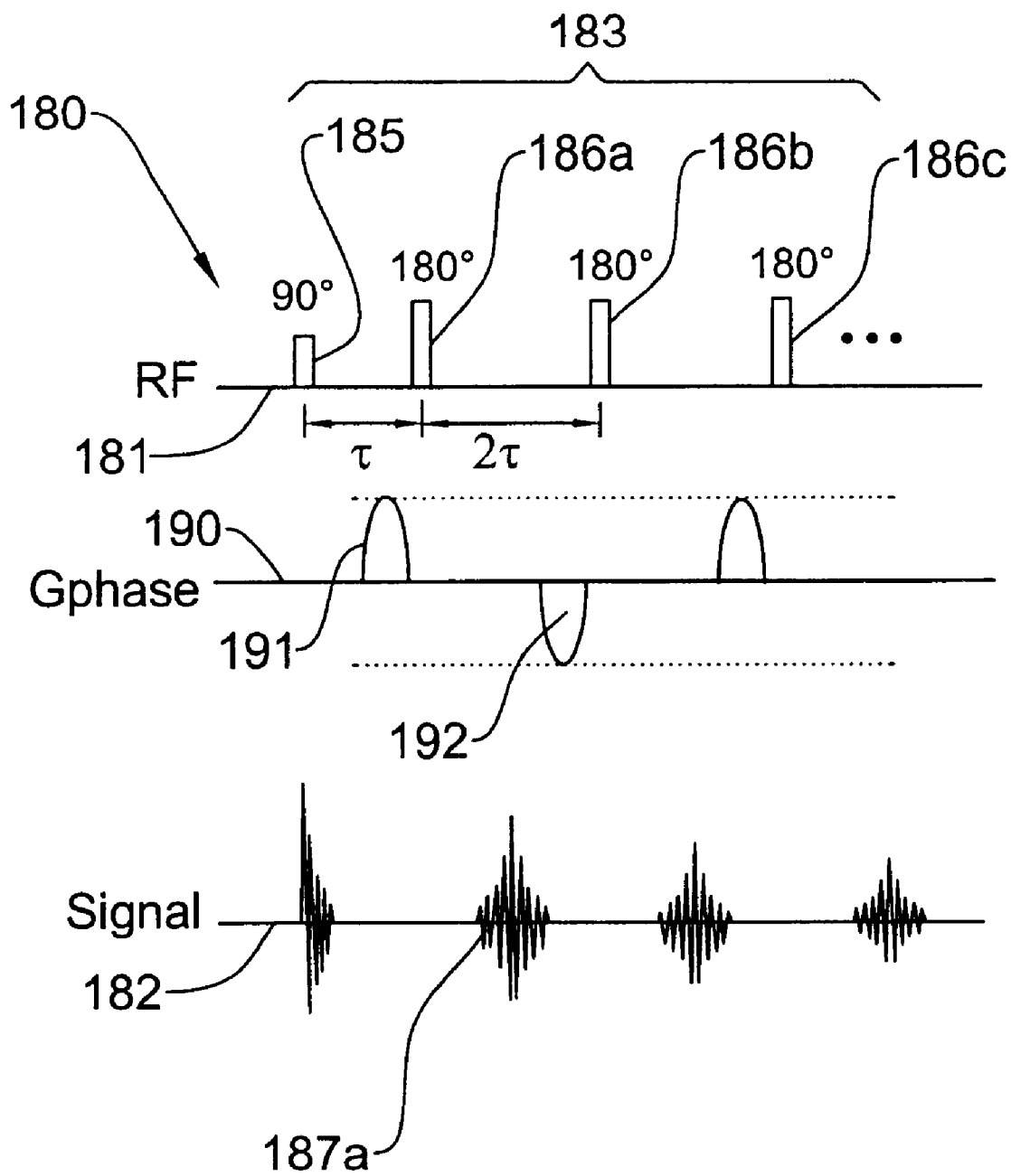
FIG. 18 illustrates the excitation scheme suitable for obtaining lateral (angular) separation based on "destructive sharpening" of the region to be imaged.

One possible example for a sequence capable of producing the above effect is shown in FIG. 18. This sequence 180 is generally similar on the sequence shown in FIG. 16, but with the gradient pulses 191 and 192 transmitted differently: A single gradient pulse is transmitted immediately prior to each of the 180°-pulses 186a, 186b and 186c, at an alternating polarity, i.e., the first gradient pulse is transmitted with a positive (or negative) sign, and the second gradient pulse is transmitted with a negative (or positive) sign, etc.

It can be shown that the magnetization phase in the XY-plane following such a sequence of gradient pulses is accumulated to a value, which substantially grows with the absolute gradient field value at the location of the magnetization vector. Angular regions characterized by substantial gradient field values will accumulate a phase, which rapidly varies over angular position, effectively destroying any contribution to the signal from that region. On the other hand, nuclear spins positioned in the vicinity of the X-axis 41 accumulate a very small phase, and therefore contribute substantially to the echo signal. By this, the reception sub-region is "sharpened" in the angular dimension.

An alternative technique for obtaining lateral ($\phi$) separation, which may obviate the need for a $\phi$-gradient coil, utilizes processing of phase variations in the receive signals acquired from overlapping imaging sectors (not shown), as the imaging probe 10 is rotated around the Z-axis.

In order to image the entire imaging sector 42, any of the above two-dimensional imaging techniques can be repeated for the different sub-regions (61a, 61b and 61c in FIG. 11) covering the imaging sector. Selection of the sub-region is done using selection of transmission pulse frequency and preferably shaping the pulse to better define the sub-region limits.

In order to obtain a complete 360° two-dimensional image of the sample surrounding the probe 10, the probe itself is preferably rotated around its axis (the Z-axis).

It should be understood that a proper calibration of the received echo signals is required as part of the signal processing algorithm. This is due to the fact that the signal corresponding to each frequency component of the echo is a complex function involving the relative volume of spins with corresponding resonance frequency, the transmission effectiveness and reception sensitivity typical to that volume, etc. These calibrations can be readily designed and carried out such that the obtained profile correctly represents the distribution of spin density (or any other NMR parameter) along the radial vector (131 in FIG. 17).

Turning back to FIG. 1, the system according to the invention operates in the following manner. The operator initiates the image acquisition process by running the imaging sequence and collecting received signals, while the imaging probe is rotated. Transmission pulses are generated at low level voltages by specific hardware located in the PC 103 of the imaging console 101. Then, the pulses are amplified by the high-power amplifier 104, and driven via transmission channel segment 112 and the interface unit 102 into the transmission channel in the catheter 100 itself. Gradient pulses are generated by the gradient generator module 113 as required by the sequence running on the PC 103, and are driven into the gradient channel in the catheter 100. NMR signals received by the imaging probe in the catheter are amplified by the interface unit 102 and transferred via the receiver channel segment 110 into data acquisition hardware in the PC 103. Acquired data is stored and processed in real time in the PC 103 memory.

At the end of the acquisition phase, the data is processed to produce a high-resolution image of a cross section of the vessel walls 107 contained in the imaging slice 21, which can be displayed on the PC 103 monitor. Multiple cross-section images can readily be collected by moving the imaging probe section 109 along the Z-axis.

It should be noted, although not specifically shown, that the same can be achieved by using an array or "stack" of imaging probes aligned along the Z-axis, or mounted along a flexible pin-like support, as the case may be. The series of cross-section images obtained by either of the above techniques can be further processed to reconstruct 3-D images of the vessel.

In accordance with the present invention, the MRI probe enables imaging of a blood vessel from within the vessel lumen, or the walls of any cavity in the human body, or in any other industrial application. Adaptation of the invention for a specific application can be done by variations in most all of the imaging probe characteristics. Additionally, the imaging method can be varied in accordance with the imaging requirements of the specific application.

The advantages of the present invention are thus self-evident. The present invention utilizes sufficiently sensitive wideband reception coil and channel, sufficiently effective wideband transmission coil and channel, sufficiently effective gradient coils, sufficiently strong static field and static field gradient, and efficient method for the acquisition of multiple short spin-echoes in a short period of time. This enables operation with extremely non-homogeneous static magnetic fields created in an extensive region of interest external to the probe, and altogether to obtain a high-resolution image of the region of interest in a short period of time. The non-homogeneity of the static magnetic field allows for advantageous use of more extremely multiple echo averaging for imaging purposes, and for improving the detection of signals originating from nuclei in materials characterized by relatively short $T_2$ values. The provision of the high sensitivity reception coil and channel enables to significantly improve the image resolution. Combination of the static field gradient inherent in the static non-homogeneous field, together with the integrated gradient coils and rotational motion of the probe allow separation in both radial and angular dimensions and the creation of two-dimensional images in the plane perpendicular to the probe axis.

It should be understood that the present invention as described above is not limited specifically to producing two-dimensional images of imaging slices and then "piling" them up for three-dimensional images of the ROI, but rather allows manipulation of the received NMR data in many different ways. Data received from some sub-regions can, for example, be used for tissue characterization and display of parameters such as chemical compositions, while data from other sub-regions may be processed to create a tissue contrast image. The resolution may be different in different sub-regions, meaning: "raw" pixels can have different sizes and shapes and the data received from the different pixels can be manipulated and interpolated to create position-dependent effective resolution, e.g., better resolution at shorter radial distances.

Furthermore, a scan of the region of interest can be carried out along the Z-axis without rotating the probe, therefore creating an X-Z plane (longitudinal) image of the vessel, or a Z-scan with display of specific tissue parameters as a function of Z position. The detection of specific atherosclerotic plaque types can be done by scanning vessel segments and measuring specific parameters indicative thereof.

What is claimed is:

1. An imaging probe for use in an MRI system, the probe comprising:
    (a) a first magnetic field source for creating a primary, substantially non-homogeneous, static magnetic field in a region outside the probe;
    (b) a second magnetic field source for creating an external time-varying magnetic field capable of exciting nuclei in an extended sub-region of the region to generate NMR signals; and
    (c) a receiver for receiving the NMR signals and generating data indicative thereof;
    wherein said first magnetic field source comprises first and second permanent magnet assemblies aligned along a longitudinal axis of the probe with a gap between them, the first and second permanent magnet assemblies are magnetized in two opposite directions along an axis perpendicular to said longitudinal axis, the primary magnetic field being thereby parallel to said longitudinal axis and having a magnetic field gradient along the axis of magnetization of the magnets.

2. The probe according to claim 1, wherein said region of substantially non-homogeneous static magnetic field forms an angular sector of an imaging slice in the region of interest, the slice surrounding the first magnetic field source in a plane perpendicular to the longitudinal axis of the probe.

3. The probe according to claim 2, wherein a transmitting coil of the second magnetic field source is mounted such that it faces said angular sector, the geometrical center of the transmitting coil coinciding with the axis of magnetization of the magnets.

4. The probe according to claim 1, wherein a receiving coil of the receiver is mounted in said gap between the permanent magnet assemblies.

5. The probe according to claim 1, wherein the gradient of the substantially non-homogeneous static magnetic field is capable of being used as an magnetic resonance imaging gradient to create an image of at least part of the region along at least one dimension, from the NMR signals.

6. An imaging probe according to claim 1, wherein the first and second magnet assemblies substantially coincide with a cylinder coaxial with the longitudinal axis.

7. An imaging probe according to claim 1, wherein the static magnetic field has a magnitude corresponding to a magnetic resonance frequency of at least 6 MHz in at least part of the region outside the probe.

8. An imaging probe according to claim 1, wherein the probe is adapted to be used inside the body.

9. An imaging probe for use in an MRI system, the probe comprising:
   (a) a first magnetic field source for creating a primary, substantially non-homogeneous, static magnetic field in a region outside the probe;
   (b) a second magnetic field source for creating an external time-varying magnetic field capable of exciting nuclei in an extended sub-region of the region to generate NMR signals; and
   (c) a receiver for receiving the NMR signals and generating data indicative thereof;
   wherein said static magnetic field monotonically decreases by about 50% within a distance from the edge of the probe volume, which is similar to the largest diameter of the probe volume in a direction perpendicular to a longitudinal axis of the probe, the probe volume being defined as the smallest convex volume which includes the magnetic field sources and the receiver.

10. An imaging probe for use in an MRI system, the probe comprising:
    (a) a first magnetic field source for creating a primary, substantially non-homogeneous, static magnetic field in a region outside the probe;
    (b) a second magnetic field source for creating an external time-varying magnetic field capable of exciting nuclei in an extended sub-region of the region to generate NMR signals; and
    (c) a receiver for receiving the NMR signals and generating data indicative thereof;
    wherein said magnetic field sources are arranged such that the extended sub-region is in the form of a sector of an imaging slice surrounding the first magnetic field source in a plane perpendicular to the longitudinal axis of the probe.

11. An imaging probe according to claim 10, wherein the first magnetic field source comprises a permanent magnet, and wherein a surface of the sub-region resonant at the mean resonance frequency of the sub-region has a radius of curvature smaller than a thickness of the permanent magnet.

12. An imaging probe according to claim 10, wherein a surface of the sub-region resonant at the mean resonance frequency of the sub-region has a radius of curvature smaller than 2 mm.

13. An imaging probe according to claim 10, and including a rotating device which rotates the probe around the longitudinal axis by an angle at least the angular width of the sector, thereby allowing the probe to scan a plurality of sectors of a region of interest in the form of a circular slice.

14. An imaging probe according to claim 13, wherein the rotating device is capable of holding the orientation of the probe to a precision less than said angular width while the second magnetic field source is exciting the nuclei and the receiver is receiving the NMR signals.

15. An imaging probe for use in an MRI system, the probe comprising:
    (a) a first magnetic field source for creating a primary, substantially non-homogeneous, static magnetic field in a region outside the probe;
    (b) a second magnetic field source for creating an external time-varying magnetic field capable of exciting nuclei in an extended sub-region of the region to generate NMR signals; and
    (c) a receiver for receiving the NMR signals and generating data indicative thereof;
    wherein said second magnetic field source has intensity and frequency range such that it is capable of efficiently and simultaneously exciting nuclear spins in the sub-region to generate NMR signals having a frequency bandwidth of more than 5% of their mean frequency value.

16. The probe according to claim 15, wherein the frequency bandwidth of the simultaneously excited nuclear spins in the sub-region is about 10% of the mean value of the magnetic resonance frequency for the nuclei in the sub-region.

17. The probe according to claim 15, wherein the gradient of the substantially non-homogeneous static magnetic field is capable of being used as an magnetic resonance imaging gradient to create an image of at least part of the region along at least one dimension, from the NMR signals.

18. An imaging probe according to claim 15, wherein the probe is adapted to be used inside the body.

19. An imaging probe for use in an MRI system, the probe comprising:
    (a) a first magnetic field source for creating a primary, substantially non-homogeneous, static magnetic field in a region outside the probe;
    (b) a second magnetic field source for creating an external time-varying magnetic field capable of exciting nuclei in an extended sub-region of the region to generate NMR signals; and
    (c) a receiver for receiving the NMR signals and generating data indicative thereof;
    wherein the receiver has sufficiently high sensitivity over a frequency bandwidth of more than 5% of the mean value of the magnetic resonance frequency for nuclei in the sub-region.

20. The probe according to claim 19, wherein said frequency bandwidth of the receiver is about 10% of the mean value of the magnetic resonance frequency for the nuclei in the sub-region.

21. An imaging probe for use in an MRI system, the probe comprising:
    (a) a first magnetic field source for creating a primary, substantially non-homogeneous, static magnetic field in a region outside the probe;
    (b) a second magnetic field source for creating an external time-varying magnetic field capable of exciting nuclei in an extended sub-region of the region to generate NMR signals;
    (c) a receiver for receiving the NMR signals and generating data indicative thereof; and
    (d) a third magnetic field source capable of creating an angular coordinate varying magnetic field within said sub-region.

22. The probe according to claim 21 wherein said third magnetic field source includes a pair of parallel solenoidal coils, which are arranged such that their axes are parallel to the longitudinal axis of the probe, and located inside the probe close to the edge of the probe volume, defined as the smallest convex volume which includes the first magnetic field source, the second magnetic field source, and the receiver.

23. The probe according to claim 22, wherein the parallel coils are wound in an opposed manner.

24. The probe according to claim 21, wherein said parallel coils are wound on ferrite cores, thereby increasing the intensity of a produced magnetic field.

25. The probe according to claim 22, wherein said angular coordinate varying field has a monotonic change of intensity with the angular coordinate.

26. The probe according to claim 21, wherein said angular coordinate varying magnetic field has substantially linear dependence on the angle within an imaging sector of a slice surrounding the probe in a plane perpendicular to a longitudinal axis of the probe.

27. The probe according to claim 21, wherein the gradient of the substantially non-homogeneous static magnetic field is capable of being used as a magnetic resonance imaging gradient in a first direction, and the angular gradient of the angular varying magnetic field is capable of being as an imaging gradient in a second, angular direction, to create an image of at least part of the region along at least two dimensions, from the NMR signals.

28. The probe according to claim 15 wherein the probe is capable of acquiring more than one hundred spin-echo signals in one excitation series having duration of a typical transverse relaxation time ($T_2$).

29. The probe according to claim 28, wherein the frequency bandwidth of the simultaneously excited nuclear spins in the sub-region is about 5%–200%, and typically 10%, of the mean value of the magnetic resonance frequency for the nuclei in the sub-region.

30. The probe according to claim 28, capable of acquiring a few thousand spin-echo signals in one excitation series having duration of a typical transverse relaxation time ($T_2$).

31. An imaging probe for use with an intravascular magnetic resonance imaging catheter, the imaging probe comprising:
a first magnetic field source for creating a primary, substantially non-homogeneous, static magnetic field in a region of a medium outside the probe;
a second magnetic field source for creating an external time-varying magnetic field, the second magnetic field when being applied to said region, is capable of exciting nuclei in an extended sub-region of the medium to generate NMR signals;
a receiver for receiving the NMR signals and generating data indicative thereof; and
a position stabilizing assembly for fixing a relative position of a distal end of the catheter relative to surrounding blood vessel walls during an image acquisition process.

32. An imaging system comprising an intravascular magnetic resonance imaging catheter and a complementary external console associated with electronics for generating transmitted signals and processing received signals, the catheter comprising a fully autonomous imaging probe mounted at the distal end of the catheter for imaging a region of interest surrounding the distal end of the catheter, wherein the probe comprising:
a first magnetic field source for creating a primary, substantially non-homogeneous, static magnetic field in a region of a medium outside the probe;
a second magnetic field source for creating an external time-varying magnetic field, the second magnetic field when being applied to said region, is capable of exciting nuclei in an extended sub-region of the medium to generate NMR signals; and
a receiver for receiving the NMR signals and generating data indicative thereof.

33. An imaging method for creating an image of a region of interest outside a probe, the method comprising the steps of:

(a) creating a primary, substantially non-homogeneous, static magnetic field in the region of interest, using a first magnetic field source comprised in the probe;
(b) creating a time-varying magnetic field within an extended sub-region of the region of substantially non-homogeneous static magnetic field, the time-varying magnetic field having intensity and frequency range such that it efficiently and simultaneously excites nuclear spins in said sub-region to generate NMR signals characterized by NMR frequency bandwidth of more than 5% of their mean frequency value;
(c) receiving the NMR signals and generating data indicative thereof.

34. The method according to claim 33 wherein the frequency bandwidth of the simultaneously excited nuclear spins in the sub-region is about 10% of the mean value of the magnetic resonance frequency for the nuclei in the sub-region.

35. The method according to claim 33, wherein at least one hundred spin-echo signals are acquired in one excitation series having duration of a typical transverse relaxation time ($T_2$).

36. The method according to claim 33, wherein said extended sub-region is in the form of a sector of a slice-like region of interest, the excitation of the nuclei in said sector by said time-varying magnetic field comprising the step of:
generating short transmission pulse bursts of sufficient power, thereby exciting successive sub-regions of said sector, each of the successive sub-regions including nuclei corresponding to a narrower resonance frequency band, as compared to that of the entire sector, the carrier frequency of each transmission pulse burst being selected according to a specific resonance frequency of the nuclei residing in the corresponding sub-region of the sector.

37. The method according to claim 36, wherein creating the static magnetic field comprises using a permanent magnet, and a surface of the sub-region resonant at the mean resonance frequency of the sub-region has a radius of curvature smaller than a thickness of the permanent magnet.

38. The method according to claim 36, wherein a surface of the sub-region resonant at the mean resonance frequency of the sub-region has a radius of curvature smaller than 2 mm.

39. The method according to claim 33, and also comprising the step of creating an additional imaging dimension of the extended sub-region.

40. The method according to claim 39, wherein the additional imaging dimension is created by phase encoding of nuclei spins within said extended sub-region in an angular dimension, by means of an angular coordinate varying magnetic field applied to said extended sub-region.

41. The method according to claim 39, wherein the additional imaging dimension is created by narrowing the extended sub-region in an angular direction, by means an angular coordinate varying magnetic field applied to said sub-region.

42. The method according to claim 33, and also comprising the step of creating successive regions of the substantially non-homogeneous static magnetic field located in a common plane, and exciting nuclei within successive extended sub-regions of the regions of the substantially non-homogeneous static magnetic field, thereby scanning and imaging the entire region of interest in the form of a circular slice.

43. The method according to claim 33, wherein generating data comprises using the gradient of the substantially non-homogeneous static magnetic field as an magnetic resonance imaging gradient to create the image of the region of interest along at least one dimension, from the NMR signals.

44. An imaging method according to claim 33, wherein the region of interest is inside the body, and including inserting the probe into the body, thereby bringing the probe closer to the region of interest.

45. An imaging probe for use in an MRI system, the probe comprising:
   (a) a first magnetic field source which creates a primary, substantially non-homogeneous, static magnetic field in a region outside the probe;
   (b) a second magnetic field source for creating an external time-varying magnetic field capable of exciting nuclei in an extended sub-region of the region to generate NMR signals; and
   (c) a receiver for receiving the NMR signals and generating data indicative thereof;
   wherein said second magnetic field source has intensity and frequency range such that it is capable of effficiently and simultaneously exciting nuclear spins in the sub-region to generate NMR signals having a frequency bandwidth of at least 250 kHz.

46. An imaging probe according to claim 45, wherein said second magnetic field source has intensity and frequency range such that it is capable of efficiently and simultaneously exciting nuclear spins in the sub-region to generate NMR signals having a frequency bandwidth of at least 500 kHz.

47. An imaging probe according to claim 46, said second magnetic field source has intensity and frequency range such that it is capable of efficiently and simultaneously exciting nuclear spins in the sub-region to generate NMR signals having a frequency bandwidth of at least 2.5 MHz.

48. An imaging probe for use in an MRI system, the probe comprising:
   (a) a first magnetic field source for creating a primary, substantially non-homogeneous, static magnetic field in a region outside the probe;
   (b) a second magnetic field source for creating an external time-varying magnetic field capable of exciting nuclei in an extended sub-region of the region to generate NMR signals; and
   (c) a receiver for receiving the NMR signals and generating data indicative thereof;
   wherein the probe volume, defined as a smallest convex volume which includes the magnetic field sources and the receiver, is less than or about equal to 2 mm in diameter.

49. An imaging method for creating an image of a region of interest outside a probe, the method comprising the steps of:
   (a) creating a primary, substantially non-homogeneous, static magnetic field in the region of interest, using a first magnetic field source comprised in the probe;
   (b) creating a time-varying magnetic field within an extended sub-region of the region of substantially non-homogeneous static magnetic field, the time-varying magnetic field having intensity and frequency range such that it efficiently and simultaneously excites nuclear spins in said sub-region to generate NMR signals characterized by NMR frequency bandwidth of at least 250 kHz;
   (c) receiving the NMR signals and generating data indicative thereof.

50. An imaging method according to claim 49, wherein the time-varying magnetic field has intensity and frequency range such that it efficiently and simultaneously excites nuclear spins in said sub-region to generate NMR signals characterized by NMR frequency bandwidth of at least 500 kHz.

51. An imaging method according to claim 50, wherein the time-varying magnetic field has intensity and frequency range such that it efficiently and simultaneously excites nuclear spins in said sub-region to generate NMR signals characterized by NMR frequency bandwidth of at least 2.5 MHz.

* * * * *